(12) United States Patent
Lee

(10) Patent No.: US 9,252,379 B2
(45) Date of Patent: Feb. 2, 2016

(54) ORGANIC LIGHT EMITTING DEVICE

(71) Applicant: LG Display Co., Ltd., Seoul (KR)

(72) Inventor: Se Hee Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/582,543

(22) Filed: Dec. 24, 2014

(65) Prior Publication Data

US 2015/0188067 A1    Jul. 2, 2015

(30) Foreign Application Priority Data

Dec. 31, 2013 (KR) .................. 10-2013-0168986

(51) Int. Cl.
| | | |
|---|---|---|
| *H01L 51/50* | (2006.01) | |
| *H01L 51/52* | (2006.01) | |
| *H01L 27/32* | (2006.01) | |

(52) U.S. Cl.
CPC .......... *H01L 51/504* (2013.01); *H01L 27/3209* (2013.01); *H01L 27/3211* (2013.01); *H01L 51/5012* (2013.01); *H01L 51/5016* (2013.01); *H01L 51/5056* (2013.01); *H01L 51/5072* (2013.01); *H01L 51/5218* (2013.01); *H01L 51/5234* (2013.01); *H01L 51/5265* (2013.01); *H01L 51/5278* (2013.01)

(58) Field of Classification Search
CPC .............. H01L 51/504; H01L 51/5278; H01L 51/5012; H01L 51/5265; H01L 51/5016; H01L 51/5056; H01L 51/5234; H01L 51/5218; H01L 27/3209; H01L 27/3211
See application file for complete search history.

(56) References Cited

U.S. PATENT DOCUMENTS

| | | | |
|---|---|---|---|
| 7,129,632 B2* | 10/2006 | Park | H01L 27/3211 313/503 |
| 7,474,049 B2* | 1/2009 | Liu et al. | 313/504 |
| 8,076,841 B2* | 12/2011 | Shiobara | H01L 27/3211 313/503 |
| 2005/0242712 A1 | 11/2005 | Sung | |
| 2009/0091255 A1 | 4/2009 | Lee et al. | |
| 2010/0052527 A1 | 3/2010 | Ikeda et al. | |
| 2012/0012820 A1 | 1/2012 | Endo et al. | |
| 2013/0240851 A1 | 9/2013 | Seo et al. | |

FOREIGN PATENT DOCUMENTS

JP        2007059124 A     3/2007

* cited by examiner

*Primary Examiner* — William Coleman
(74) *Attorney, Agent, or Firm* — Dentons US LLP

(57) ABSTRACT

Disclosed is an organic light emitting device that may, for example, include a red pixel including a first red emission layer and a second red emission layer that emit red lights; a green pixel including a first green emission layer and a second green emission layer that emit green lights; a blue pixel including a first blue emission layer and a second blue emission layer that emit blue lights; and a first electrode and a second electrode that supply electric charges to the red, green and blue pixels, wherein a first emission layer and a second emission layer of at least one of the red, green and blue pixels include different materials between a fluorescent material and a phosphor material.

14 Claims, 15 Drawing Sheets

FIG. 2
Prior Art

|  | blue (nm) | green (nm) | red (nm) |
|---|---|---|---|
| ETL | 35 | 35 | 35 |
| EML | 20 | 40 | 36 |
| red HTL | - | - | 90 |
| green HTL | - | 20 | - |
| HTL | 110 | 110 | 110 |
| HIL | 10 | 10 | 10 |

FIG. 3
Prior Art

| division | blue | green | red | device performance | | | | | | panel simulation | | |
|---|---|---|---|---|---|---|---|---|---|---|---|---|
| | | | | blue | | green | | red | | white: Vdd, Cd/A color coordinates: 0.299, 0.315 | T95 | consumption power 40% on |
| | | | | V, Cd/A (color coordinates) | T95 | V, Cd/A (color coordinates) | T95 | V, Cd/A (color coordinates) | T95 | | | |
| comparative example | fluorescent | phosphor | phosphor | 4.1V, 5.3Cd/A (0.143, 0.042) | ~170 Hrs | 3.9V, 108.5Cd/A (0.205, 0.732) | ~600 Hrs | 4.2V, 49.7Cd/A (0.674, 0.323) | ~800 Hrs | Vdd = 8.5V 43 Cd/A | ~550 Hrs | 757mW |

FIG. 5

| case | case 1-1 | case 1-2 | case 2-1 | case 2-2 | case 3-1 | case 3-2 |
|---|---|---|---|---|---|---|
| unit 1 (EML1) | fluorescent | phosphor | fluorescent | phosphor | fluorescent | phosphor |
| unit 2 (EML2) | fluorescent | phosphor | fluorescent | phosphor | fluorescent | phosphor |
| pixel | red | red | green | green | blue | blue |

FIG. 6

| Division | blue | | green | | red | |
|---|---|---|---|---|---|---|
| | EML1 | EML2 | EML1 | EML2 | EML1 | EML2 |
| first embodiment | fluorescent | fluorescent | fluorescent | fluorescent | fluorescent | fluorescent |
| second embodiment | phosphor | phosphor | phosphor | phosphor | phosphor | phosphor |
| third embodiment | fluorescent | fluorescent | fluorescent | fluorescent | phosphor | phosphor |
| fourth embodiment | fluorescent | phosphor | fluorescent | phosphor | fluorescent | phosphor |
| fifth embodiment | fluorescent | fluorescent | fluorescent | phosphor | phosphor | phosphor |
| sixth embodiment | fluorescent | fluorescent | fluorescent | phosphor | fluorescent | fluorescent |
| seventh embodiment | fluorescent | fluorescent | fluorescent | phosphor | fluorescent | phosphor |

FIG. 9

| division | blue | | green | | red | | device performance | | | | | | |
|---|---|---|---|---|---|---|---|---|---|---|---|---|---|
| | EML 1 | EML 2 | EML 1 | EML 2 | EML 1 | EML 2 | blue | | green | | red | | |
| | | | | | | | V, Cd/A, (color coordinates) | T95 Hrs | V, Cd/A, (color coordinates) | T95 Hrs | V, Cd/A, (color coordinates) | T95 Hrs | |
| first embodiment | fluorescent | fluorescent | fluorescent | fluorescent | fluorescent | fluorescent | 6.7V, 8.1Cd/A (0.143, 0.042) | ~600 | 7V, 111Cd/A (0.210, 0.73) | ~1100 | 6.5V, 38Cd/A (0.675, 0.323) | ~1800 | |
| second embodiment | phosphor | phosphor | phosphor | phosphor | phosphor | phosphor | 7V, 11.5Cd/A (0.143, 0.055) | ~150 | 7V, 161Cd/A (0.180, 0.73) | ~1300 | 9.5V, 80Cd/A (0.674, 0.323) | ~1400 | |
| third embodiment | fluorescent | fluorescent | fluorescent | fluorescent | phosphor | phosphor | 6.7V, 8.1Cd/A (0.143, 0.042) | ~600 | 7V, 111Cd/A (0.210, 0.73) | ~1100 | 9.5V, 80Cd/A (0.674, 0.323) | ~1400 | |
| fourth embodiment | fluorescent | phosphor | fluorescent | phosphor | fluorescent | phosphor | 7V, 9.1Cd/A (0.143, 0.045) | ~450 | 7V, 130Cd/A (0.215, 0.73) | ~1200 | 8.0V, 55Cd/A (0.675, 0.323) | ~1500 | |
| fifth embodiment | fluorescent | fluorescent | fluorescent | phosphor | phosphor | phosphor | 6.7V, 8.1Cd/A (0.143, 0.042) | ~600 | 7V, 130Cd/A (0.215, 0.73) | ~1200 | 9.5V, 80Cd/A (0.674, 0.323) | ~1400 | |
| sixth embodiment | fluorescent | fluorescent | fluorescent | phosphor | fluorescent | fluorescent | 6.7V, 8.1Cd/A (0.143, 0.042) | ~600 | 7V, 130Cd/A (0.215, 0.73) | ~1200 | 6.5V, 38Cd/A (0.675, 0.323) | ~1800 | |
| seventh embodiment | fluorescent | fluorescent | fluorescent | phosphor | fluorescent | phosphor | 6.7V, 8.1Cd/A (0.143, 0.042) | ~600 | 7V, 130Cd/A (0.215, 0.73) | ~1200 | 8.0V, 55Cd/A (0.675, 0.323) | ~1500 | |

FIG. 10

| division | blue | | green | | red | | panel simulation | | |
|---|---|---|---|---|---|---|---|---|---|
| | EML 1 | EML 2 | EML 1 | EML 2 | EML 1 | EML 2 | white: Vdd, Cd/A color coordinates 0.299, 0.315 | T95 (Hrs) | consumption power 40% on |
| first embodiment | fluorescent | fluorescent | fluorescent | fluorescent | fluorescent | fluorescent | 11V, 48.9Cd/A | ~1150 | 890mW |
| second embodiment | phosphor | phosphor | phosphor | phosphor | phosphor | phosphor | 13.5V, 69.7Cd/A | ~825 | 742mW |
| third embodiment | fluorescent | fluorescent | fluorescent | fluorescent | phosphor | phosphor | 13.5V, 59.5Cd/A | ~1150 | 861mW |
| fourth embodiment | fluorescent | phosphor | fluorescent | phosphor | fluorescent | phosphor | 12V, 58.6Cd/A | ~1125 | 769mW |
| fifth embodiment | fluorescent | fluorescent | fluorescent | phosphor | phosphor | phosphor | 13.5V, 62.7Cd/A | ~1175 | 819mW |
| sixth embodiment | fluorescent | fluorescent | fluorescent | phosphor | fluorescent | fluorescent | 11.5V, 54.2Cd/A | ~1200 | 706mW |
| seventh embodiment | fluorescent | fluorescent | fluorescent | phosphor | fluorescent | phosphor | 12V, 57.6Cd/A | ~1200 | 735mW |

FIG. 11

| division | blue | green | red | Correlated Color Temperature simulation (T95) | | | | |
|---|---|---|---|---|---|---|---|---|
| | | | | service life (Hrs) | CCT | color coordinates | | |
| | | | | | | CIE_x | CIE_y | |
| comparative example | fluorescent | phosphor | phosphor | 0 | 7509 | 0.299 | 0.315 | |
| | | | | 550 | 6673 | 0.309 | 0.331 | |

FIG. 12

| division | blue | | green | | red | | Correlated Color Temperature simulation (T95) | | | |
|---|---|---|---|---|---|---|---|---|---|---|
| | EML 1 | EML 2 | EML 1 | EML 2 | EML 1 | EML 2 | | | | |
| first embodiment | fluore scent | fluore scent | fluore scent | fluore scent | fluore scent | fluore scent | service life | 0 | | 1150 | |
| | | | | | | | CCT | 7509 | | 6093 | |
| | | | | | | | color coordinates | 0.299 | 0.315 | 0.304 | 0.321 |
| second embodiment | phosp hor | phosp hor | phosp hor | phosp hor | phosp hor | phosp hor | service life | 0 | | 825 | |
| | | | | | | | CCT | 7509 | | 7709 | |
| | | | | | | | color coordinates | 0.299 | 0.315 | 0.319 | 0.348 |
| third embodiment | fluore scent | fluore scent | fluore scent | fluore scent | phosp hor | phosp hor | service life | 0 | | 1150 | |
| | | | | | | | CCT | 7509 | | 7081 | |
| | | | | | | | color coordinates | 0.299 | 0.315 | 0.304 | 0.321 |
| fourth embodiment | fluore scent | phosp hor | fluore scent | phosp hor | fluore scent | phosp hor | service life | 0 | | 1125 | |
| | | | | | | | CCT | 7509 | | 6924 | |
| | | | | | | | color coordinates | 0.299 | 0.315 | 0.306 | 0.325 |
| fifth embodiment | fluore scent | fluore scent | fluore scent | phosp hor | phosp hor | phosp hor | service life | 0 | | 1175 | |
| | | | | | | | CCT | 7509 | | 7123 | |
| | | | | | | | color coordinates | 0.299 | 0.315 | 0.303 | 0.321 |
| sixth embodiment | fluore scent | fluore scent | fluore scent | phosp hor | fluore scent | fluore scent | service life | 0 | | 1200 | |
| | | | | | | | CCT | 7509 | | 7057 | |
| | | | | | | | color coordinates | 0.299 | 0.315 | 0.304 | 0.322 |
| seventh embodiment | fluore scent | fluore scent | fluore scent | phosp hor | fluore scent | phosp hor | service life | 0 | | 1200 | |
| | | | | | | | CCT | 7509 | | 7057 | |
| | | | | | | | color coordinates | 0.299 | 0.315 | 0.304 | 0.322 |

FIG. 15

| division | blue | | green | | red | |
|---|---|---|---|---|---|---|
| | EML1 | EML2 | EML1 | EML2 | EML1 | EML2 |
| eighth embodiment | fluorescent | phosphor | phosphor | phosphor | phosphor | phosphor |
| ninth embodiment | phosphor | phosphor | fluorescent | phosphor | phosphor | phosphor |
| tenth embodiment | phosphor | phosphor | phosphor | phosphor | fluorescent | phosphor |
| eleventh embodiment | fluorescent | phosphor | fluorescent | phosphor | phosphor | phosphor |
| twelfth embodiment | fluorescent | phosphor | phosphor | phosphor | fluorescent | phosphor |
| thirteenth embodiment | phosphor | phosphor | fluorescent | phosphor | fluorescent | phosphor |

FIG. 16

| division | blue | | green | | red | |
|---|---|---|---|---|---|---|
| | EML1 | EML2 | EML1 | EML2 | EML1 | EML2 |
| fourteenth embodiment | phosphor | fluorescent | phosphor | fluorescent | phosphor | fluorescent |
| fifteenth embodiment | phosphor | fluorescent | fluorescent | fluorescent | fluorescent | fluorescent |
| sixteenth embodiment | fluorescent | fluorescent | phosphor | fluorescent | fluorescent | fluorescent |
| seventeenth embodiment | fluorescent | fluorescent | fluorescent | fluorescent | phosphor | fluorescent |
| eighteenth embodiment | phosphor | fluorescent | phosphor | fluorescent | fluorescent | fluorescent |
| nineteenth embodiment | phosphor | fluorescent | fluorescent | fluorescent | phosphor | fluorescent |
| twentieth embodiment | fluorescent | fluorescent | phosphor | fluorescent | phosphor | fluorescent |

ORGANIC LIGHT EMITTING DEVICE

CROSS-REFERENCE TO RELATED APPLICATIONS

This application claims the benefit of the Korean Patent Application No. 10-2013-0168986, filed on Dec. 31, 2013, which is hereby incorporated by reference for all purposes as if fully set forth herein.

BACKGROUND OF THE INVENTION

1. Field of the Invention

The present invention relates to an organic light emitting device and method of manufacturing the same, and more particularly, to an organic light emitting device with improved emission efficiency and/or service life.

2. Discussion of the Related Art

To date, liquid crystal display (LCD) devices are being widely used as flat panel display devices. LCD devices use a backlight as a separate light source, and have technical limitations in brightness and contrast. On the other hand, since organic light emitting devices self-emit light, organic light emitting devices do not need a separate light source and have relatively better brightness, contrast, and viewing angle, and thus, interest in organic light emitting devices is increasing. Also, since organic light emitting devices do not use a backlight, organic light emitting devices can be manufactured to be thin and lightweight, and have low power consumption and fast response time.

Organic light emitting devices are categorized into a top emission type, a bottom emission type, and a dual emission type depending on emission direction of light. Organic light emitting devices are categorized into passive matrix organic light emitting devices and active matrix organic light emitting devices depending on driving mode.

FIG. 1 is a diagram illustrating a red, green, and blue pixel structure of an organic light emitting device having a micro-cavity structure according to the related art. FIG. 1 illustrates a pixel structure of an active matrix organic light emitting device having a top emission type.

Referring to FIG. 1, the organic light emitting device includes an anode electrode 10, a cathode electrode 70, and an organic emission layer. The organic light emitting device according to the related art has a structure in which the organic emission layer is formed between the cathode electrode 70 injecting electrons and the anode electrode 10 injecting positive holes. A capping layer (CPL) 80 is formed on the cathode electrode 70.

The anode electrode 10 is formed as a reflective electrode, and the cathode electrode 70 is formed as a semi-transmissive electrode, thereby forming a micro-cavity structure. An optical cavity is formed between the cathode electrode 70 and the anode electrode 10. The cathode electrode 70 transmits some (e.g., 60%) of the light emitted from the organic emission layer, and the remaining light (e.g., 40%), which is not transmitted, is reflected to cause constructive interference suitable for each wavelength, thereby enhancing emission efficiency.

The organic emission layer includes a hole injection layer (HIL) 20, a hole transport layer (HTL) 30, a plurality of emission layers (EMLs) 52, 54 and 56, an electron injection layer (EIL, not shown), and an electron transport layer (ETL) 60. In this case, the electron injection layer (EIL) may be omitted.

One unit pixel includes a red pixel Rp, a green pixel Gp and a blue pixel Bp of three colors. The organic emission layer of the red pixel further includes a red HTL 42. The organic emission layer of the green pixel further includes a green HTL 44.

The red emission layer 52 of the red pixel Rp is formed between the ETL 60 and the red HTL 42. The green emission layer 54 of the green pixel Gp is formed between the ETL 60 and the green HTL 44. The blue emission layer 56 of the blue pixel Bp is formed between the ETL 60 and the HTL 30.

When electrons generated from the cathode electrode 70 and holes generated from the anode electrode 10 are injected into the EMLs 52, 54 and 56, the injected electrons and holes are recombined to generate excitons. The generated excitons are shifted from an excited state to a lower-energy state to emit red light, green light, and blue light from the red EML 52, the green EML 54, and the blue EML 56, respectively.

Due to an emission structure and a material of the emission layer, the organic light emitting device according to the related may have limitations in emission characteristic and performance of service life.

To address such a limitation, a method has been proposed in which emission efficiency is enhanced by changing a fluorescent material to a phosphor material for the emission layers 52, 54 and 56. However, this method may also have a problem in that more power is consumed as luminance increases, and moreover, emission efficiency may become lowered when the light emitting material is changed for securing a long service life.

As the resolution of display devices advances to a high resolution, the number of pixels per unit area increases, and high luminance is needed. However, due to an emission structure of the organic light emitting device according to the related art, the luminance of the unit area may be limited, and due to increase in an applied current, the reliability of the organic light emitting device may be degraded, and the power consumption may increase.

Moreover, among pixels of three colors of the organic light emitting device, the blue pixel may have a shorter service life than those of the red and green pixels, and thus, the service life of the organic light emitting device may not be ensured.

SUMMARY OF THE INVENTION

Accordingly, the present invention is directed to provide an organic light emitting device and method of manufacturing the same that substantially obviates one or more problems due to limitations and disadvantages of the related art.

An advantage of the present invention is to provide an organic light emitting device with improved emission efficiency and/or service life.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting device may, for example, include a red pixel including a first red emission layer and a second red emission layer that emit red lights; a green pixel including a first green emission layer and a second green emission layer that emit green lights; a blue pixel including a first blue emission layer and a second blue emission layer that emit blue lights; and a first electrode and a second electrode that supply electric charges to the red, green and blue pixels, wherein a first emission layer and a second emission layer of at least one of the red, green and blue pixels include different materials between a fluorescent material and a phosphor material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 2 is a table showing thickness of the organic emission layer (for example, ETL, EML, HTL, red HTL, green HTL, and HIL) formed in each of a red pixel, a green pixel, and a blue pixel of the comparative example illustrated in FIG. 1;

FIG. 3 is a table showing performance of the comparative example and simulation result of an organic light emitting diode (OLED) panel;

FIG. 5 is a table showing that a first emission layer and a second emission layer are formed of either a phosphor material or a fluorescent material;

FIG. 6 is a table showing types of a first emission layer and a second emission layer of an organic light emitting device according to the first to seventh embodiments of the present invention;

FIG. 9 is a table showing performance of an organic light emitting device according to the first to seventh embodiments of the present invention;

FIG. 10 is a table showing simulation results of an OLED panel applied to an organic light emitting device according to the first to seventh embodiments of the present invention;

FIG. 11 is a table showing correlated color temperature (CCT) with respect to T95 when driving time of an organic light emitting device according to the related art elapses;

FIG. 12 is a table showing CCT with respect to T95 when driving time of an organic light emitting device according to the first to seventh embodiments of the present invention elapses;

FIG. 15 is a table showing a first emission layer and a second emission layer of an organic light emitting device according to the eight to thirteenth embodiments of the present invention; and FIG. 16 is a table showing a first emission layer and a second emission layer of an organic light emitting device according to the fourteenth to twentieth embodiments of the present invention.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

The terms described in the specification should be understood as follows.

As used herein, the singular forms "a", "an" and "the" are intended to include the plural forms as well, unless the context clearly indicates otherwise. The terms "first" and "second" are for differentiating one element from another element, and the scope of these elements should not be limited by these terms.

It should be further understood that the terms "comprises", "comprising", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

In description of embodiments of the present invention, when a structure is described as being formed at an upper portion/lower portion of another structure or on/under the other structure, this description should be construed as including a case where the structures contact each other as well as a case where a third structure(s) is disposed therebetween.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Figure 1:
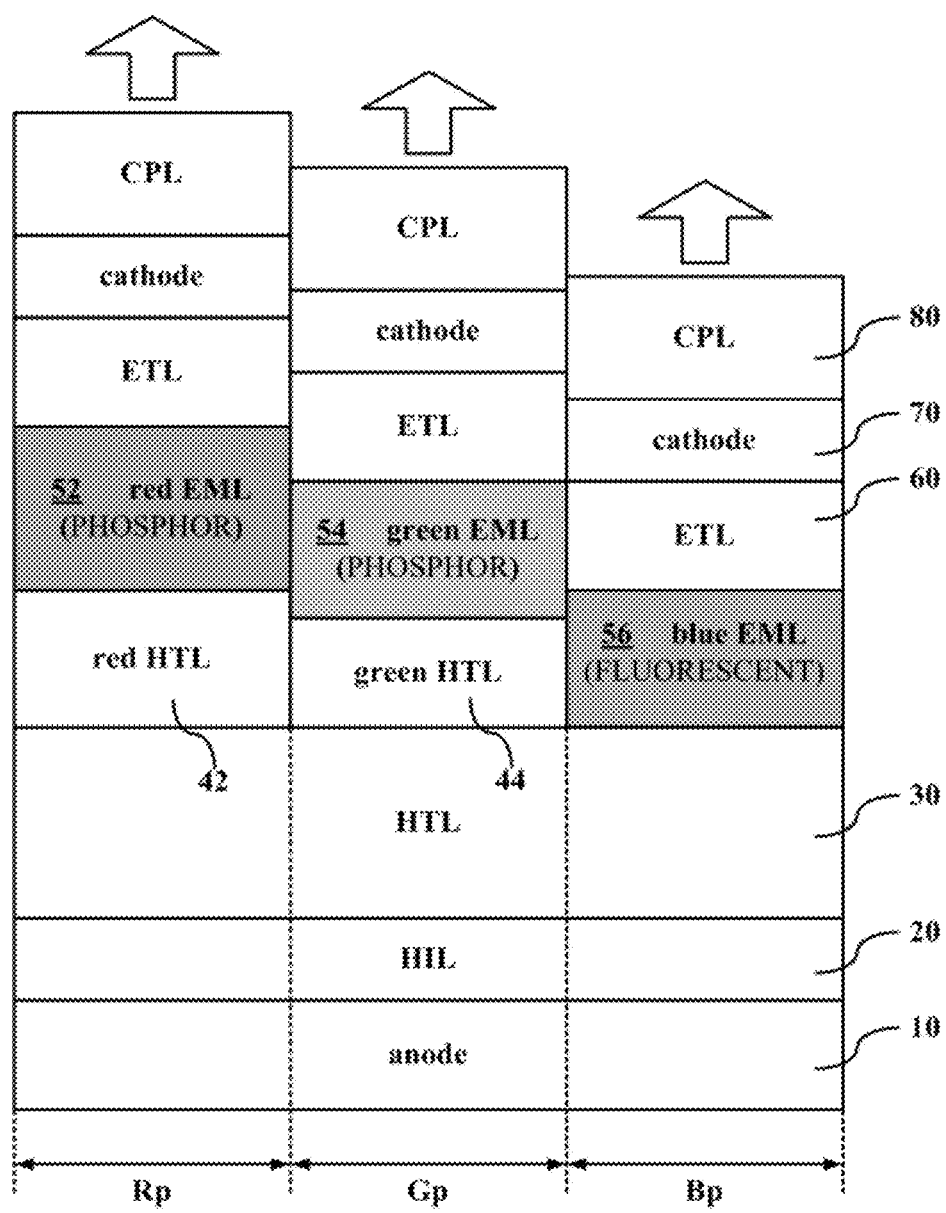
FIG. 1 is a diagram illustrating a red, green and blue pixel structure of an organic light emitting device having a microcavity structure according to the related art.

The organic light emitting device of FIG. 1 according to the related art is selected as a comparative example for comparing luminance, color coordinates, power consumption and service life of an organic light emitting device according to embodiments of the present invention. Hereinafter, the comparative example will be first described with reference to the drawings, and then, embodiments of the present invention will be described in detail with reference to the accompanying drawings.

Comparative Example

An anode electrode 10 of the comparative example is a reflective electrode, and is formed in a structure where an indium tin oxide (ITO) layer (70 Å), a reflective layer (APC, 100 Å), and an ITO layer (70 Å) are stacked. In this case, the reflective layer (APC) is formed of an alloy which contains silver (Ag) by 90% or more. The anode electrode 10 is formed in units of a unit pixel. One unit pixel is composed of a red pixel, a green pixel, and a blue pixel of three colors, and the pixels of three colors are divided by a bank. However, the comparative example is not limited thereto, and the anode electrode 10 may be formed in each of the red, green and blue pixels.

FIG. 2 is a table showing thickness of the organic emission layer (for example, ETL, EML, HTL, red HTL, green HTL, and HIL) formed in each of the red, green and blue pixels of the comparative example illustrated in FIG. 1.

The organic emission layer is formed under the following conditions for measuring luminance, color coordinates, power consumption and service life of the comparative example.

A hole injection layer (HIL) 20 is formed by depositing HAT-CN on the anode electrode 10 to a thickness of 10 nm. A hole transport layer (HTL) 30 is formed by depositing NPD on the HIL 20 to a thickness of 110 nm.

A green HIL 44 is formed in the green pixel area Gp by depositing a TPD material to a thickness of 20 nm. A red HTL 42 is formed in the red pixel area Rp by depositing NPD to a thickness of 90 nm.

A red EML 52 is formed in the red pixel area Rp. The red EML 52 is formed to a thickness of 36 nm by doping btp$_2$Ir (acac) (which is a red dopant (RD)) on Be complex derivatives (which are a red host (RH)) by 5%. In this case, a dopant of the red EML 52 uses a phosphor material.

A green EML 54 is formed in the green pixel area Gp. The green EML 54 is formed to a thickness of 40 nm by doping ppy$_2$Ir(acac) (which is a green dopant (GD)) on CBP (which is a green host (GH)) by 5%. In this case, a dopant of the green EML 54 uses a phosphor material.

A blue EML 56 is formed in the blue pixel area Bp. The blue EML 56 is formed to a thickness of 20 nm by doping Pyren derivatives (which are a blue dopant (BD)) on Anthracene derivatives (which are a blue host (BH)) by 5%. In this case, a dopant of the blue EML 56 uses a fluorescent material.

An ETL 60 is formed by doping Alq$_3$ on the EMLs 52, 54 and 56 to a thickness of 35 nm. A second electrode (cathode electrode) 70 which is a transparent electrode or a semi-transparent electrode is formed by forming a LiF layer on the ETL 60 to a thickness of 15 Å and forming a Ag:Mg layer at a ratio of 1:1 to a thickness of 160 Å. A capping layer 80 is formed by depositing NPD to a thickness of 65 nm to cover the pixels.

FIG. 3 is a table showing performance of the comparative example and a simulation result of an organic light emitting diode (OLED) panel.

Referring to FIG. 3, an organic emission layer is formed under the conditions described above with reference to FIGS. 1 and 2, and then, color coordinates, luminance, power consumption and service life of each of the red, green and blue pixels have been measured.

TABLE 1

| | | blue | green | red | white |
|---|---|---|---|---|---|
| color | CIE_x | 0.143 | 0.205 | 0.674 | 0.299 |
| | CIE_y | 0.042 | 0.732 | 0.323 | 0.315 |

Referring to Table 1, the color coordinates of the blue light from the blue pixel Bp are CIE_x of 0.143 and CIE_y of 0.042. The color coordinates of the green light from the green pixel Gp are CIE_x of 0.205 and CIE_y of 0.732. The color coordinates of the red light from the red pixel Rp are CIE_x of 0.674 and CIE_y of 0.323. Also, the color coordinates of the white light obtained by combining the blue light, green light and red light are CIE_x of 0.299 and CIE_y of 0.315.

The luminance of the blue light is 5.3 Cd/A, the luminance of the green light is 108.5 Cd/A, the luminance of the red light is 49.7 Cd/A, and the luminance of the white light is 43 Cd/A.

With respect to T95 (time taken when light luminance becomes 95% of its initial value), the service life of the blue pixel is 170 or less hours, the service life of the green pixel is 600 or less hours, and the service life of the red pixel is 800 or less hours.

When the red pixel, the green pixel and the blue pixel are applied to an OLED panel, T95 is equal to or less than 550 hours, and power consumption is 757 mW. In this case, the service life of the blue pixel is shorter than those of the red pixel and the green pixel, and thus, when the red pixel, the green pixel and the blue pixel are applied to an OLED panel as-is, the service life of the OLED panel becomes shorter.

Pixel Structures According to Embodiments of the Present Invention

Figure 4:
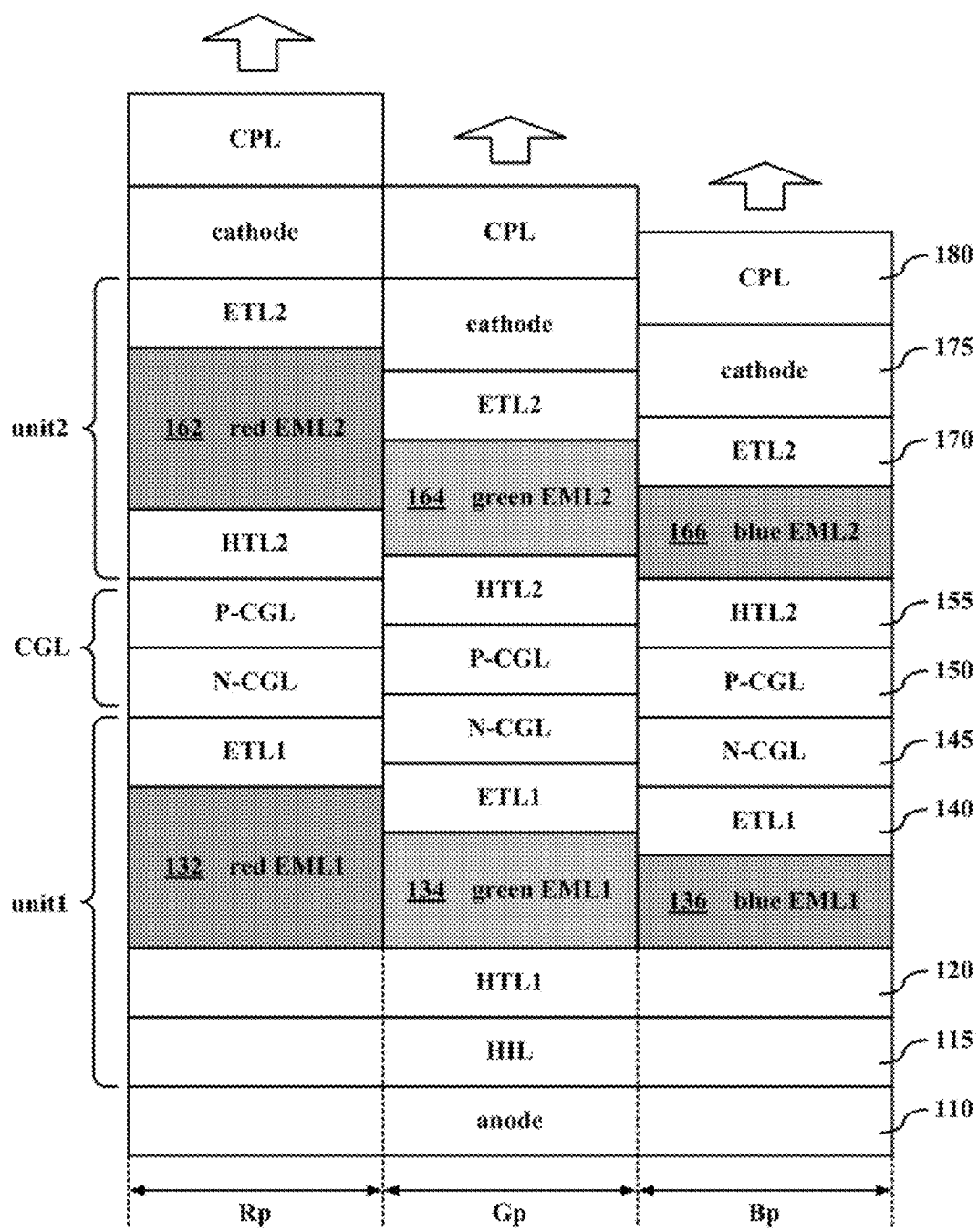
FIG. 4 is a diagram illustrating a red, green and blue pixel structure of an organic light emitting device according to an embodiment of the present invention.

FIG. 4 is a diagram illustrating a red, green and blue pixel structure of an organic light emitting device according to an embodiment of the present invention. FIG. 4 illustrates a pixel structure having a top-emission type to which a micro-cavity structure is applied.

Referring to FIG. 4, the organic light emitting device includes a first electrode (an anode electrode) 110, a second electrode (a cathode electrode) 175, and an organic emission layer. The organic light emitting device has a structure in which the organic emission layer is formed between the first electrode (the anode electrode) 110 injecting positive holes and the second electrode (the cathode electrode) 175 injecting electrons. A capping layer (CPL) 180 is formed on the second electrode (the cathode electrode) 175 to a thickness of 65 nm.

The organic light emitting device has a micro-cavity structure, and one unit pixel includes a red pixel Rp, a green pixel Gp and a blue pixel Bp of three colors.

The organic emission layer of the organic light emitting is formed in a structure of two emission units. A first emission unit (unit1) and a second emission unit (unit2) of each of the red pixel, the green pixel and the blue pixel have a structure that emits light of the same color.

The first emission unit (unit1) of the red pixel Rp includes a first red emission layer (red EML1) 132 that emits red light, and the second emission unit (unit2) of the red pixel Rp includes a second red emission layer (red EML2) 162 that emits red light.

The first emission unit (unit1) of the green pixel Gp includes a first green emission layer (green EML1) 134 that emits green light, and the second emission unit (unit2) of the green pixel Gp includes a second green emission layer (green EML2) 164 that emits green light.

The first emission unit (unit1) of the blue pixel Bp includes a first blue emission layer (blue EML1) 136 that emits blue light, and the second emission unit (unit2) of the blue pixel Bp includes a second blue emission layer (blue EML2) 166 that emits blue light.

The first electrode (the anode electrode) 110 is formed as a reflective electrode, and the second electrode (the cathode electrode) 175 is formed as a transparent (transmissive) electrode or a semi-transparent electrode, thereby forming a micro-cavity.

Here, the first electrode (the anode electrode) 110 is a reflective electrode, and may be formed in a structure where an ITO layer (70 Å), a reflective layer (APC, 100 Å), and an ITO layer (70 Å) are stacked. In this case, the reflective layer (APC) may be formed of an alloy which contains silver (Ag) by 90% or more.

A material of the reflective layer (APC) may use palladium (Pd), copper (Cu), indium (In), or neodymium (Nd), in addition to Ag. Also, the material of the APC may use an alloy in which at least one selected from Pd, Cu, In, and Nd is added into Ag.

The first electrode (the anode electrode) 110 is formed in units of one unit pixel. One unit pixel is composed of a red pixel, a green pixel, and a blue pixel of three colors, and the pixels of three colors are divided by a bank (not shown). However, the present embodiment is not limited thereto, and the anode electrode 10 may be, for example, formed in each of the red, green and blue pixels.

The second electrode (the cathode electrode) 175, which is a semi-transmissive electrode, is formed to the same thickness in the red pixel Rp, the green pixel Gp and the blue pixel Bp. For example, the second electrode (the cathode electrode) 175 is formed as a semi-transmissive electrode by forming a LiF layer on a second ETL (ETL2) 170 to a thickness of 15 Å and forming a Ag:Mg layer at a ratio of 1:1 to a thickness of 160 Å.

An optical cavity is formed between the first electrode (the anode electrode) 110 and the second electrode (the cathode electrode) 175. The second electrode (the cathode electrode) 175 transmits some (e.g., 60%) of the light emitted from the organic emission layer, and the remaining light (e.g., 40%), which is not transmitted, is reflected to cause constructive interference suitable for each wavelength, thereby enhancing emission efficiency.

The organic emission layer includes an HIL 115, a first HTL (HTL1) 120, a first red EML (red EML1) 132, a first green EML (green EML1) 134, a first blue EML (blue EML1) 136, a first ETL (ETL1) 140, a first charge generation layer (N-CGL) 145, a second charge generation layer (P-CGL) 150, a second HTL (HTL2) 155, a second red EML (red EML2) 162, a second green EML (green EML2) 164, a second blue EML(blue EML2) 166, and a second ETL (ETL2) 170.

The HIL 115 is formed on the first electrode (the anode electrode) 110, and the first HTL (HTL1) 120 is formed on the HIL 115. The first red EML (red EML1) 132 is formed in the red pixel area Rp, the first green EML (green EML1) 134 is formed in the green pixel area Gp, and the first blue EML (blue EML1) 136 is formed in the blue pixel area Bp, on the first HTL (HTL1) 120.

The first ETL (ETL1) 140 is formed on the first red EML (red EML1), the first green EML (green EML1) 134 and the first blue EML (blue EML1) 136. A charge generation layer (CGL) is formed on the first ETL (ETL1) 140.

The charge generation layer (CGL) includes a first charge generation layer (N-CGL) 145 and a second charge generation layer (P-CGL) 150. The first charge generation layer (N-CGL) 145 is formed on the first ETL (ETL1) 140, and the second charge generation layer (P-CGL) 150 is formed on the first charge generation layer (N-CGL) 145.

The second red EML (red EML2) 162 is formed in the red pixel area Rp, the second green EML (green EML2) 164 is formed in the green pixel area Gp, and the second blue EML (blue EML2) 166 is formed in the blue pixel area Bp, on the second charge generation layer (P-CGL) 150.

The second ETL (ETL2) 170 is formed on the second red EML (red EML2) 162, the second green EML (green EML2) 164 and the second blue EML (blue EML2) 166. The cathode 175 is formed on the second ETL 170, and the capping layer 180 is formed on the cathode 175.

The first emission unit (unit1) of the organic emission layer includes the HIL 115, the first HTL (HTL1) 120, the first red EML (red EML1) 132, the first green EML (green EML1) 134, the first blue EML (blue EML1) 136, and the first ETL (ETL1) 140.

The second emission unit (unit2) of the organic emission layer includes the second HTL (HTL2) 155, the second red EML (red EML2) 162, the second green EML (green EML2) 164, the second blue EML (blue EML2) 166, and the second ETL (ETL2) 170.

The first charge generation layer (N-CGL) 145 and the second charge generation layer (P-CGL) 150 are formed between the first emission unit (unit1) and the second emission unit (unit2).

The organic emission layer of the red pixel Rp may be formed to a thickness of 250 nm to 300 nm. A thickness of the organic emission layer of the red pixel Rp denotes a thickness of a gap between the first electrode (the anode electrode) 110 and the second electrode (the cathode electrode) 175.

The first red EML (red EML1) 132 and the second red EML (red EML2) 162 may be formed to a thickness of 55 nm to 85 nm.

Here, the first red EML (red EML1) 132 and the second red EML (red EML2) 162 which are formed in the red pixel Rp may be formed to the same thickness, but the present embodiment is not limited thereto. For example, the first red EML (red EML1) 132 and the second red EML (red EML2) 162 which are formed in the red pixel Rp may be formed to different thicknesses.

The organic emission layer of the green pixel Gp may be formed to a thickness of 200 nm to 270 nm. A thickness of the organic emission layer of the green pixel Gp denotes a thickness of a gap between the first electrode (the anode electrode) 110 and the second electrode (the cathode electrode) 175.

The first green EML (green EML1) 134 and the second green EML (green EML2) 164 may be formed to a thickness of 30 nm to 50 nm.

Here, the first green EML (green EML1) 134 and the second green EML (green EML2) 164 which are formed in the green pixel Gp may be formed to the same thickness, but the present embodiment is not limited thereto. For example, the first green EML (green EML1) 134 and the second green EML (green EML2) 164 which are formed in the green pixel Gp may be formed to different thicknesses.

The organic emission layer of the blue pixel Bp may be formed to a thickness of 150 nm to 230 nm. A thickness of the organic emission layer of the blue pixel Bp denotes a thickness of a gap between the first electrode (the anode electrode) 110 and the second electrode (the cathode electrode) 175.

The first blue EML (blue EML1) 136 and the second blue EML (blue EML2) 166 may be formed to a thickness of 10 nm to 30 nm.

Here, the first blue EML (blue EML1) 136 and the second blue EML (blue EML2) 166 which are formed in the blue pixel Bp may be formed to the same thickness, but the present embodiment is not limited thereto. For example, the first blue EML (blue EML1) 136 and the second blue EML (blue EML2) 166 which are formed in the blue pixel Bp may be formed to different thicknesses.

The HIL 115, the first HTL (HTL1) 120, the first ETL (ETL1) 140, the first charge generation layer (N-CGL) 145, the second charge generation layer (P-CGL) 150, the second HTL (HTL2) 155, the second ETL (ETL2) 170, the cathode 175, and the capping layer 180 are formed in common in correspondence with the red pixel Rp, the green pixel Gp and the blue pixel Bp.

The HIL 115, the first HTL (HTL1) 120, the first ETL (ETL1) 140, the first charge generation layer (N-CGL) 145, the second charge generation layer (P-CGL) 150, the second HTL (HTL2) 155, the second ETL (ETL2) 170, the cathode 175 and the capping layer 180 may be formed to the same thickness in the red pixel Rp, the green pixel Gp, and the blue pixel Bp.

Red light, green light, and blue light are emitted by adjusting a charge balance of positive holes and electrons and an exciton generation area in which light is emitted in the EML.

Each of the red pixel Rp, the green pixel Gp and the blue pixel Bp has a micro-cavity structure, and the color cavity may be controlled to adjust a sense of color.

Here, the blue pixel Bp may adjust a sense of color of blue light by controlling a thickness of the first HTL (HTL1) 120 of the first emission unit.

The red pixel Rp and the green pixel Gp may adjust a sense of color of red light and green light by controlling a thickness of the EML. A sense of color of red light may be adjusted by controlling a thickness of at least one selected from the first red EML (red EML1) 132 and the second red EML (red EML2) 162. A sense of color of green light may be adjusted by controlling a thickness of at least one selected from the first green EML (green EML1) 134 and the second green EML (green EML2) 164.

That is, in the red pixel Rp, a sense of color of red light may be satisfied by controlling an optical distance of the color cavity by using a thickness of at least one selected from the first red EML (red EML1) 132 and the second red EML (red EML2) 162.

In the green pixel Gp, a sense of color of green light may be satisfied by controlling an optical distance of the color cavity by using a thickness of at least one selected from the first green EML (green EML1) 134 and the second green EML (green EML2) 164.

A phosphor material forming the red EML, the green EML and the blue EML may have a long service life, but may be low in light efficiency. On the other hand, a fluorescent material may be high in light efficiency, but may have a short service life.

Material of Organic Emission Layer

The HIL 115 may be formed of HAT-CN, TBAHA, F$_4$-TCNQ, or CuPc described in the following Formula 1.

[Formula 1]

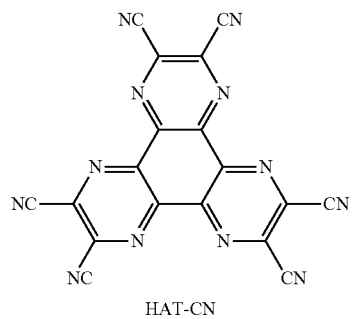
HAT-CN

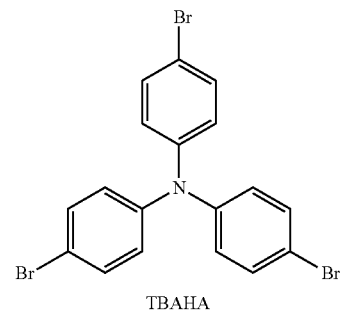
TBAHA

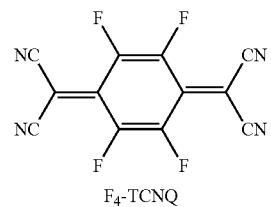
F$_4$-TCNQ

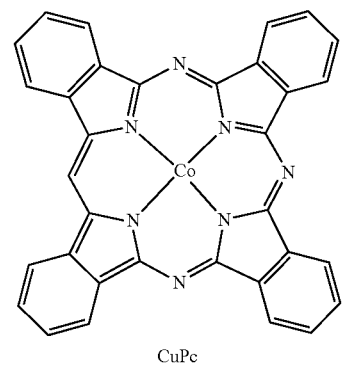
CuPc

The first ETL (ETL1) 140 and the second ETL (ETL2) 170 may be formed of spiro-PBD, BMB-3T, PF-6P, PyPySPyPy, COT, TPBI, oxadiazole derivatives, or Anthracene derivatives described in the following Formulas 2 to 9.

[Formula 2]
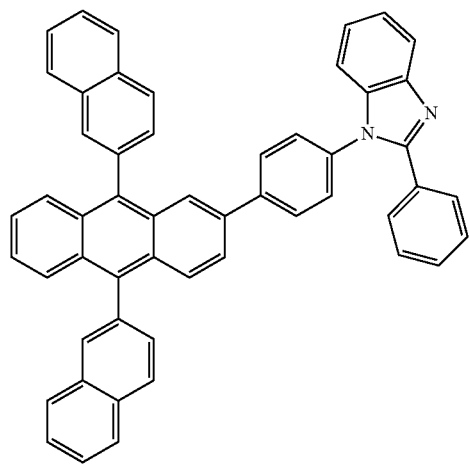
[Formula 3]
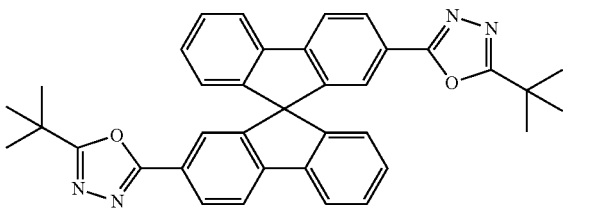
spiro-PBD
[Formula 4]
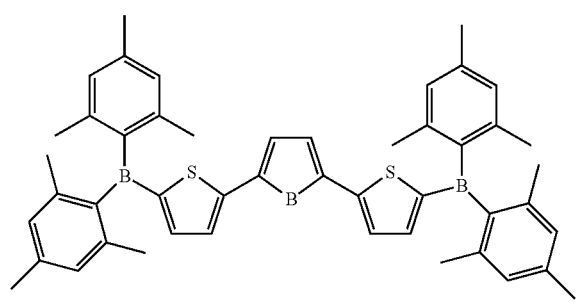
BMB-3T
[Formula 5]
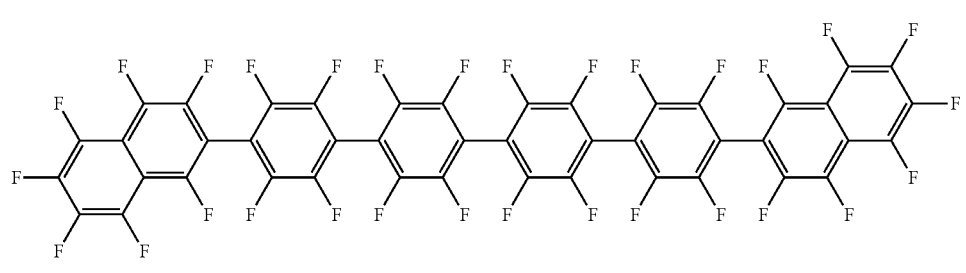
PF-6P
[Formula 6]
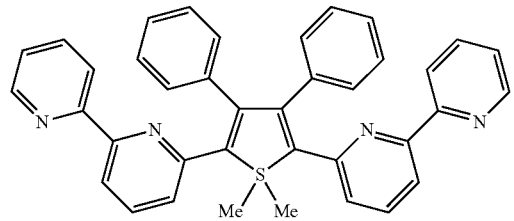
PyPySPyPy
[Formula 7]
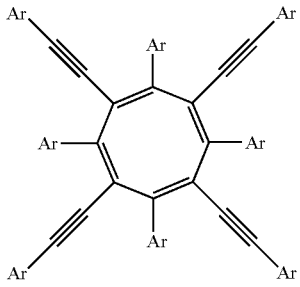
COT

[Formula 8]
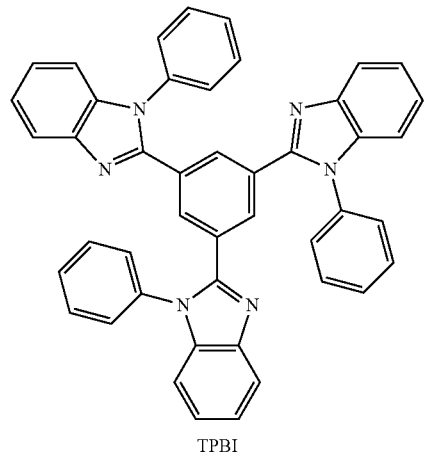
TPBI
[Formula 9]
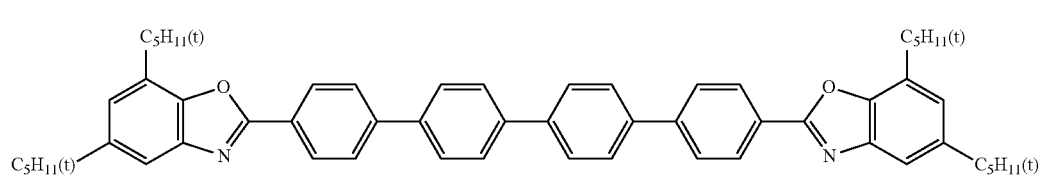
A phosphor material of the blue EML may use materials of the following Formulas 10 to 17.
[Formula 10]
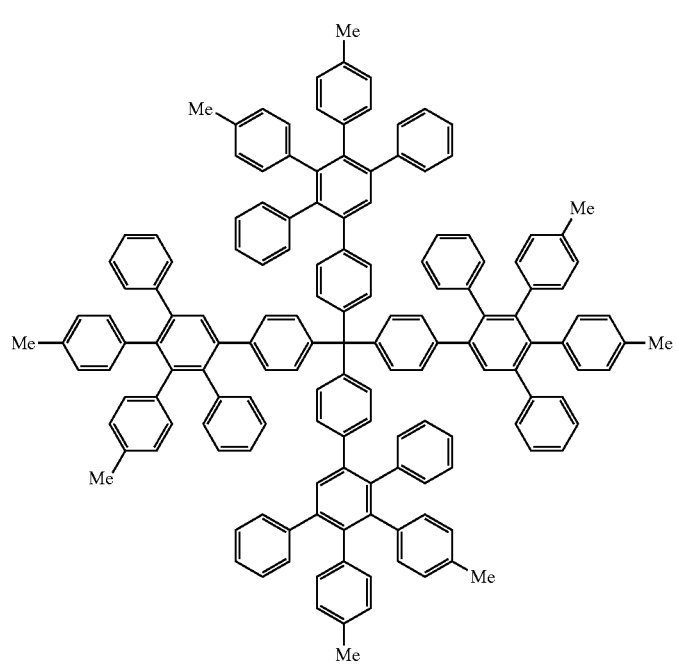

-continued
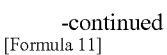
[Formula 11]
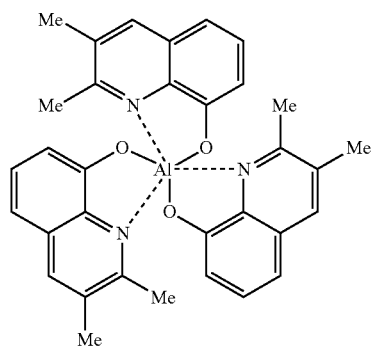
Aldmq₃
[Formula 12]
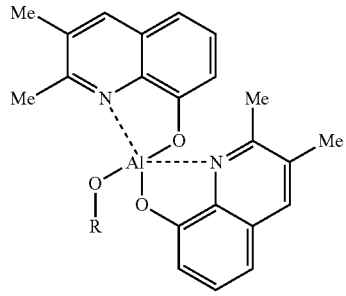
SAlq/AlMq₂OH
[Formula 13]
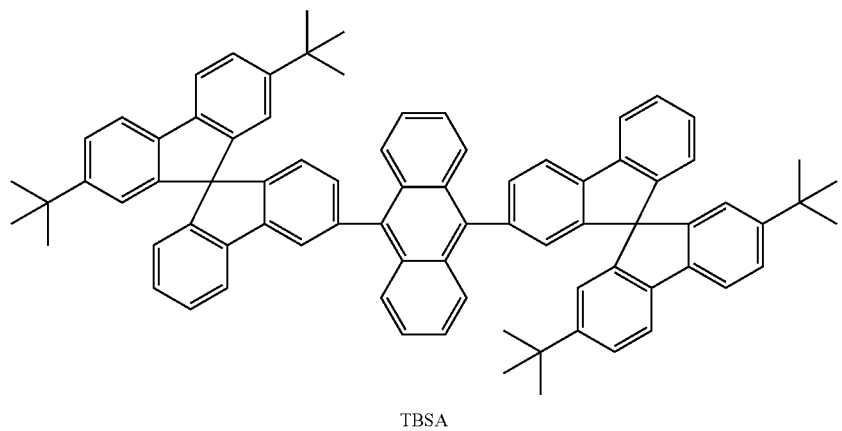
TBSA
[Formula 14]
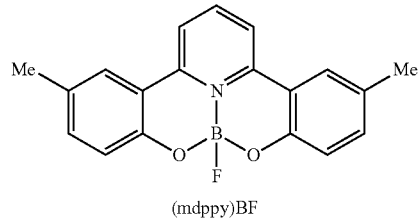
(mdppy)BF
[Formula 15]
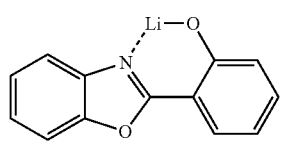
LiPBO
[Formula 16]
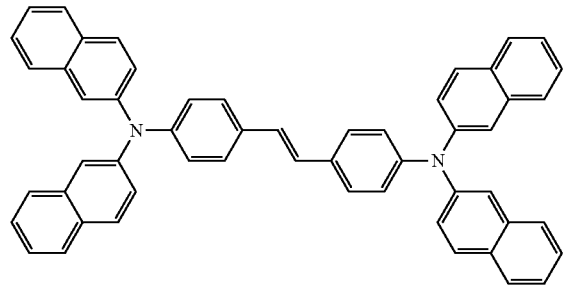
[Formula 17]
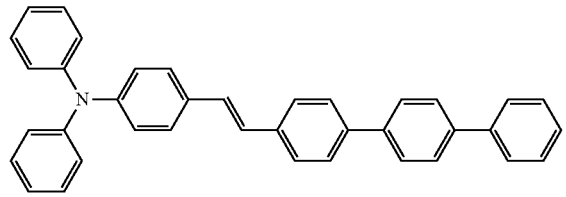
A host (BH) of a blue fluorescent material may use a material of the following Formula 18.

[Formula 18]

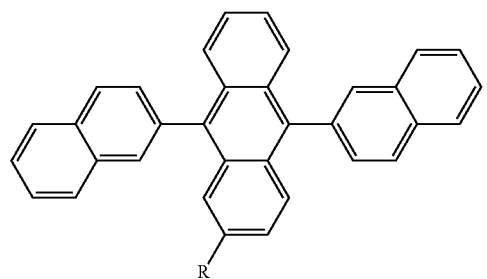

DNA/mADN/TBADN

A dopant (BD) of the blue fluorescent material may use a material of the following Formula 19.

[Formula 19]

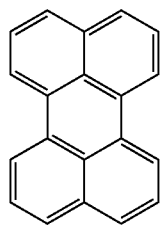

Perylene

However, the present embodiment is not limited thereto. A material of the blue EML may use DAS, DSA-amin, 1-DNA, DNA/mADN/TBADN, or spiro-oligo(phenylene), and a light emitting material having various structures and various derivatives may be applied.

A green fluorescent material may use materials of the following Formulas 20 to 25.

[Formula 20]

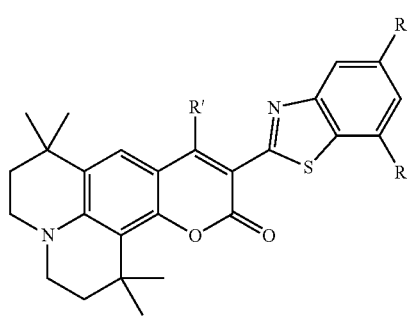

C545T

[Formula 21]

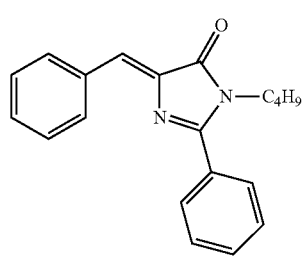

[Formula 22]

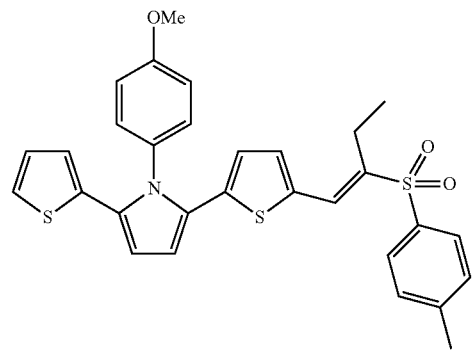

[Formula 23]

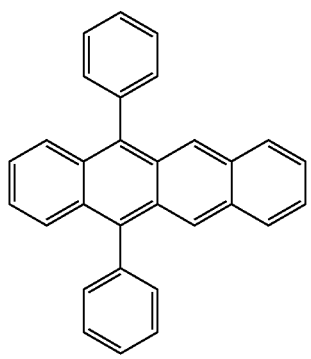

[Formula 24]

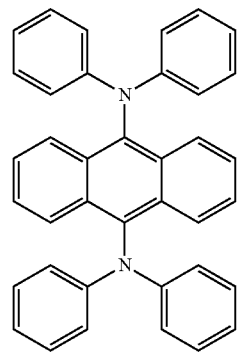

[Formula 25]

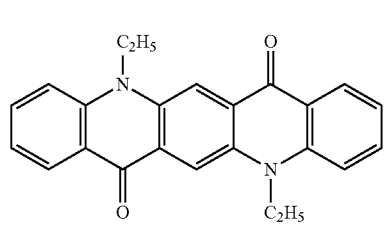

Quinacridone

A red fluorescent material may use materials of the following Formulas 26 to 30.

[Formula 26]
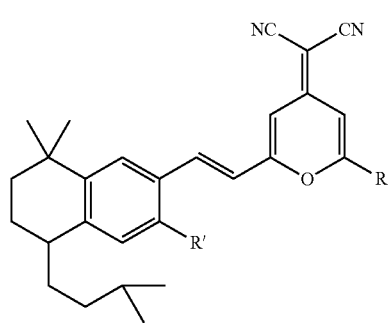
DCJTB
[Formula 27]
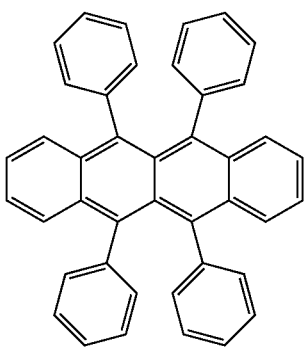
Rubrene
[Formula 28]
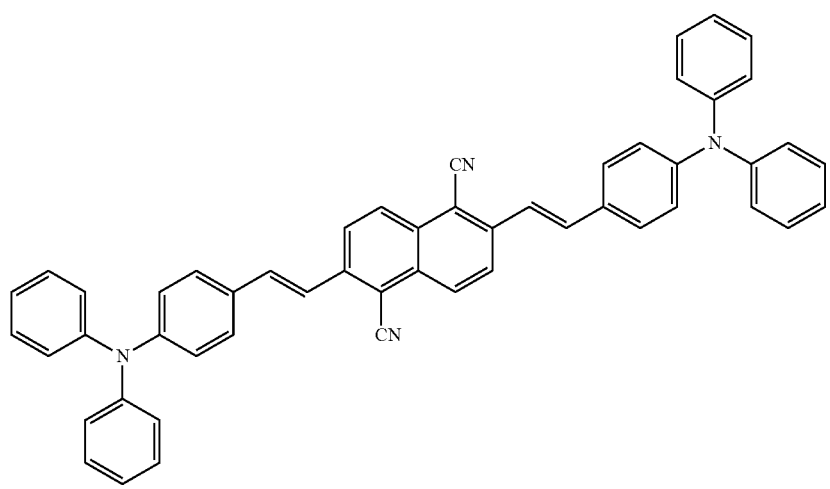
BSN
[Formula 29]
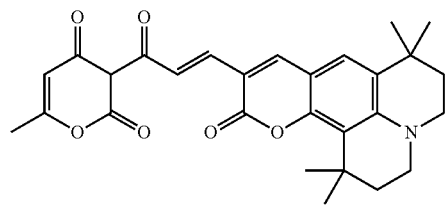
AAAP
[Formula 30]
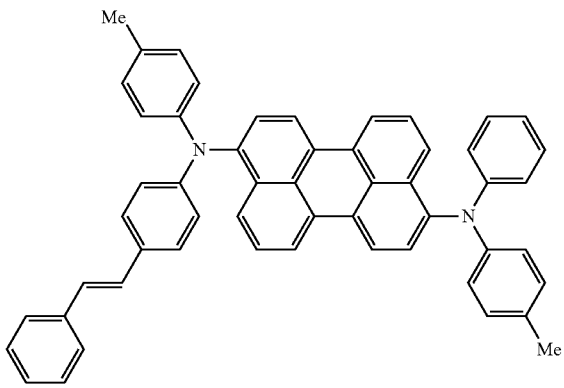
(PPA)(PSA)Pe-1
A host of a phosphor material of the blue EML may use materials of the following Formulas 31 to 37.

[Formula 31]
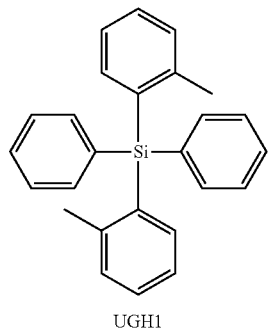
UGH1
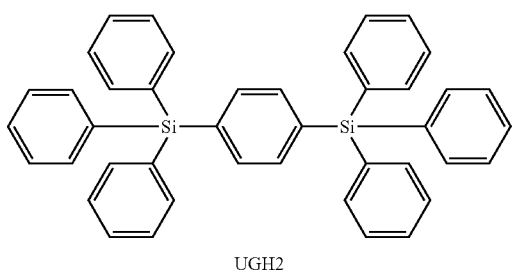
UGH2
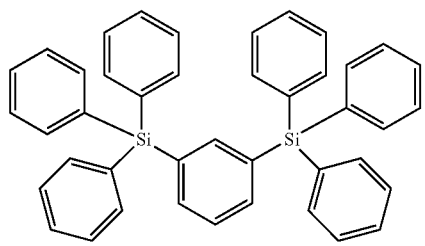
UGH3
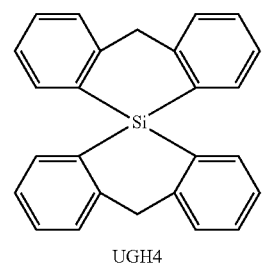
UGH4
[Formula 32]
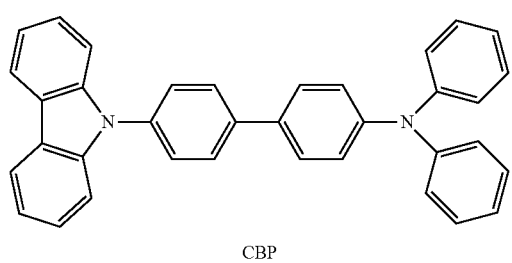
CBP
[Formula 33]
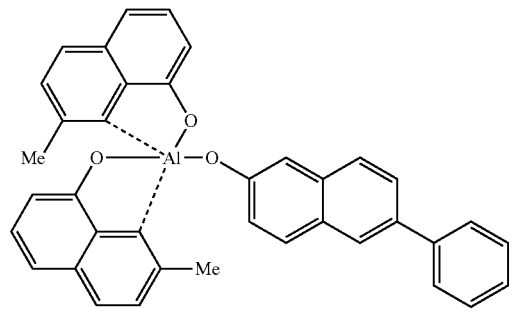
Balq'
[Formula 34]
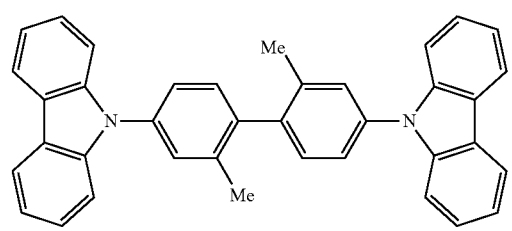
CDBP
[Formula 35]
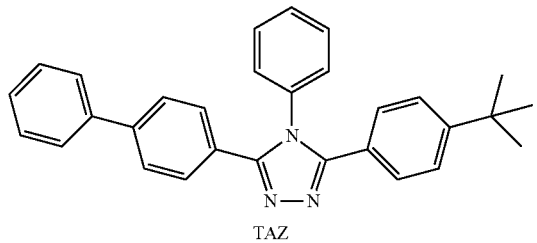
TAZ
[Formula 36]
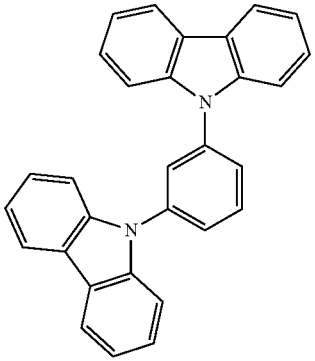
mCP
[Formula 37]
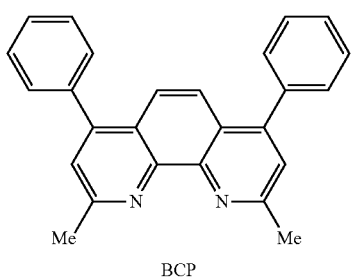
BCP A host of a phosphor material of each of the red EML and the green EML may use materials of the following Formulas 38 to 44.
[Formula 38]
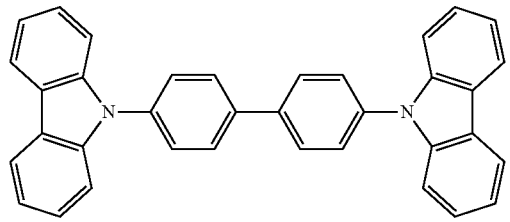
CBP
[Formula 39]
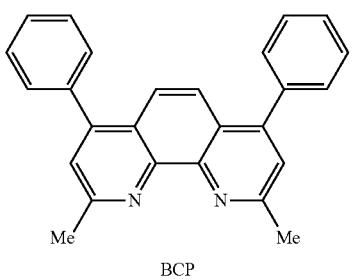
BCP
[Formula 40]
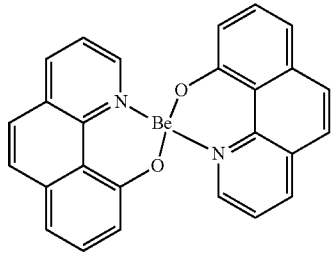
BeBq$_2$
[Formula 41]
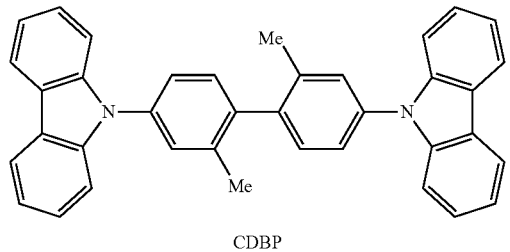
CDBP
[Formula 42]
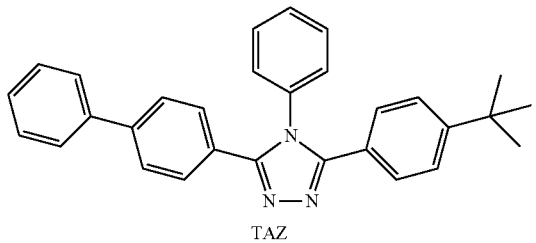
TAZ
[Formula 43]
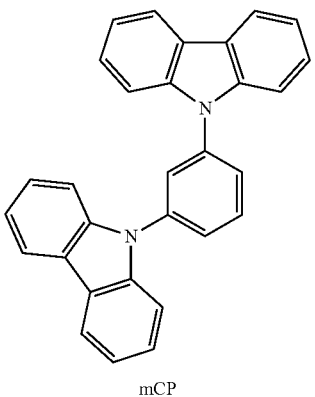
mCP
[Formula 44]
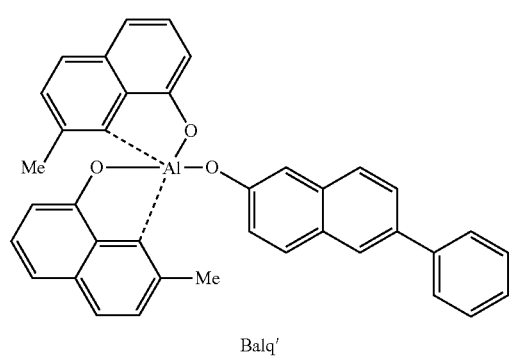
Balq'
A dopant of a phosphor material of the red EML may use a material of the following Formula 45.
[Formula 45]
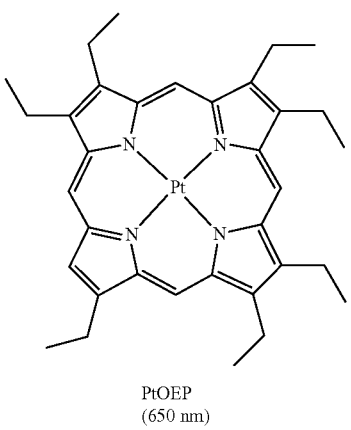
PtOEP
(650 nm)

-continued
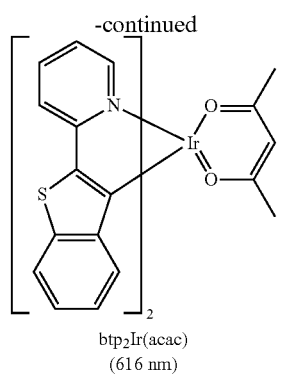
btp₂Ir(acac)
(616 nm)
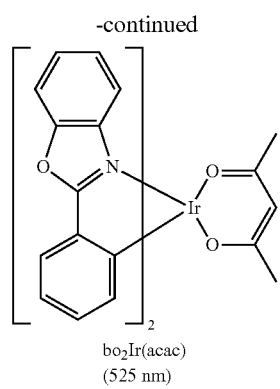
bo₂Ir(acac)
(525 nm)
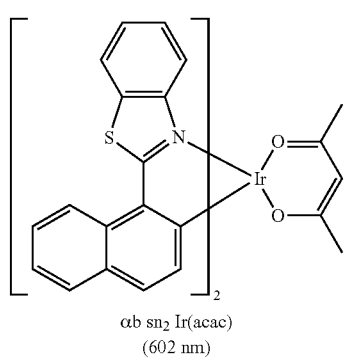
αb sn₂ Ir(acac)
(602 nm)
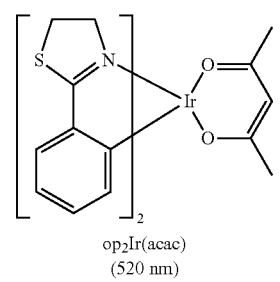
op₂Ir(acac)
(520 nm)
A dopant of a phosphor material of the green EML may use a material of the following Formula 46.
[Formula 46]
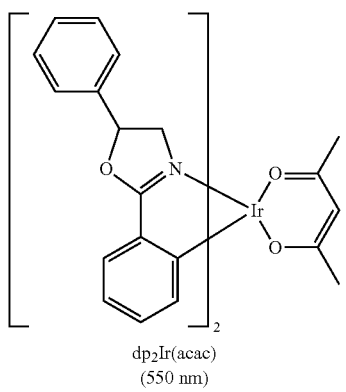
dp₂Ir(acac)
(550 nm)
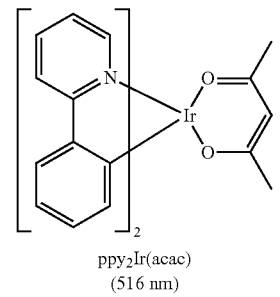
ppy₂Ir(acac)
(516 nm)
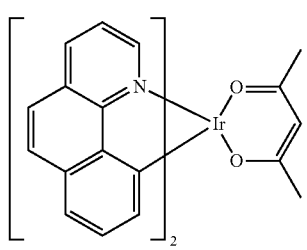
bzq₂Ir(acac)
(548 nm)
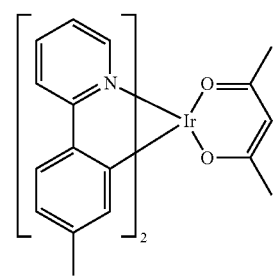
tpy₂Ir(acac)
(512 nm)
A dopant of a phosphor material of the blue EML may use a material of the following Formula 47.

[Formula 47]

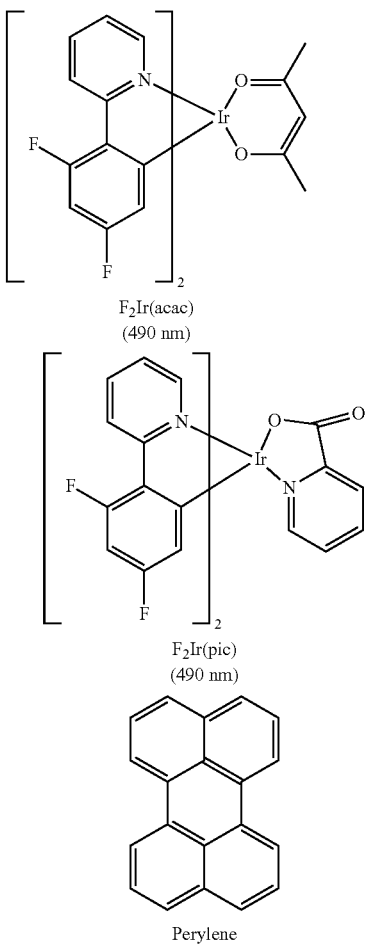

F₂Ir(acac)
(490 nm)

F₂Ir(pic)
(490 nm)

Perylene

However, the present embodiment is not limited thereto, and a host of a phosphor material may be changed to each derivatives. A dopant of a phosphor material may contain Ir complex. At least one selected from the EML (ELM1) of the first emission unit (unit1) and the EML (ELM2) of the second emission unit (unit2) may be formed by mixing two or more types of hosts. Also, at least one selected from the EML (ELM1) of the first emission unit (unit1) and the EML (ELM2) of the second emission unit (unit2) may be formed by mixing two or more types of dopants.

FIG. 5 is a table showing that both the first emission layer and the second emission layer are formed of either a phosphor material or a fluorescent material.

Referring to FIG. 5, as in case 1-1, the first red EML (red EML1) 132 and second red EML (red EML2) 162 of the red pixel may all be formed of a fluorescent material.

As in case 2-1, the first green EML (green EML1) 134 and second green EML (green EML2) 164 of the green pixel may all be formed of a fluorescent material.

As in case 3-1, the first blue EML (blue EML1) 136 and second blue EML (blue EML2) 166 of the blue pixel may all be formed of a fluorescent material.

As in case 1-2, the first red EML (red EML1) 132 and second red EML (red EML2) 162 of the red pixel may all be formed of a phosphor material.

As in case 2-2, the first green EML (green EML1) 134 and second green EML (green EML2) 164 of the green pixel may all be formed of a phosphor material.

As in case 3-2, the first blue EML (blue EML1) 136 and second blue EML (blue EML2) 166 of the blue pixel may all be formed of a phosphor material.

As described above, when the first and second EMLs of each of the red pixel, the green pixel and the blue pixel are formed of only a phosphor material or a fluorescent material, light efficiency may be reduced, or service life may be shortened.

FIG. 6 is a table showing types of a first emission layer and a second emission layer of an organic light emitting device according to first to seventh embodiments of the present invention.

Referring to FIG. 6, in the first embodiment of the present invention, the first EML (EML1) and the second EML (EML2) are all formed of a phosphor material. On the other hand, in the second embodiment of the present invention, the first EML (EML1) and the second EML (EML2) are all formed of a fluorescent material.

Experiment Conditions of First Embodiment of the Present Invention

Figure 7:
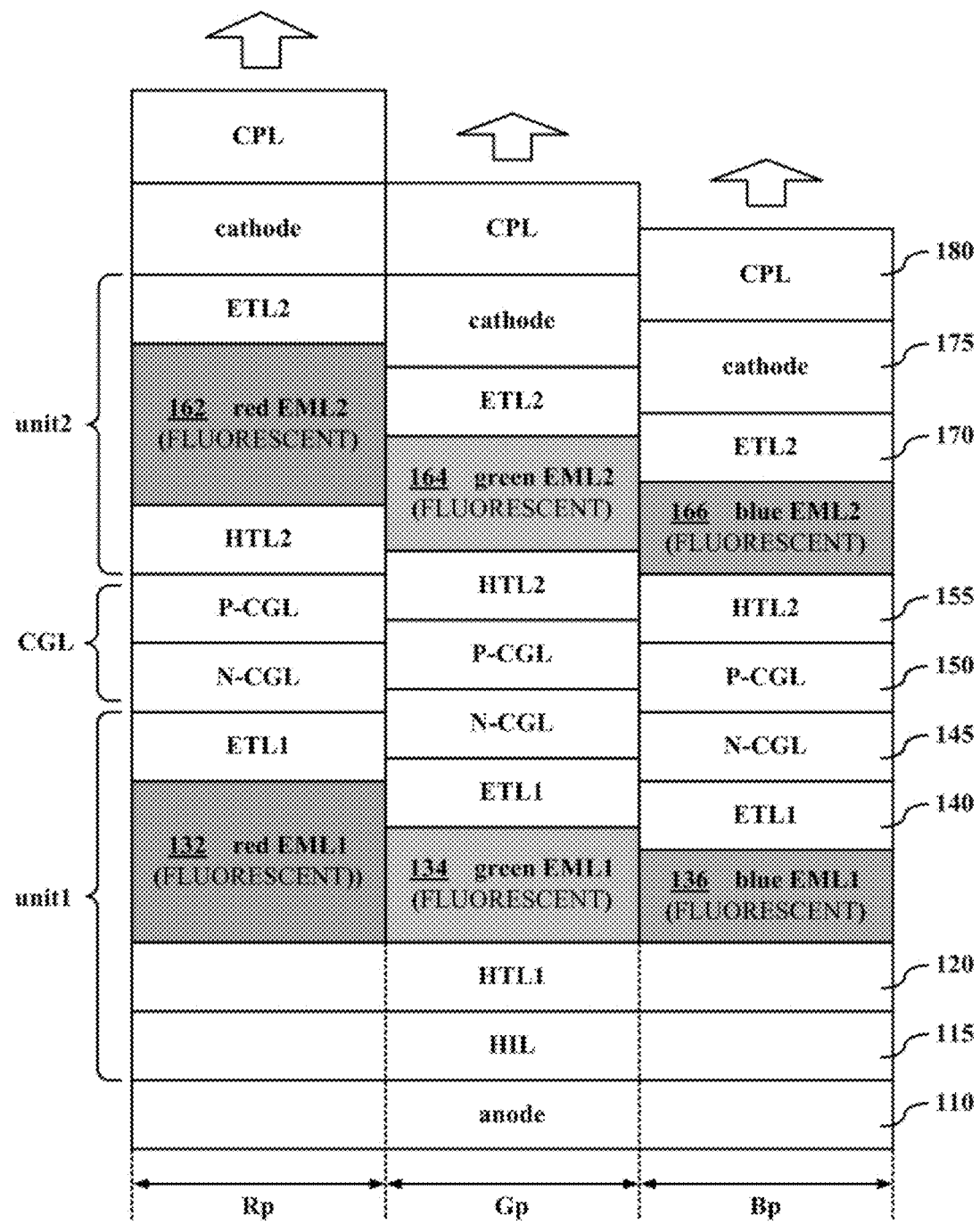
FIG. 7 is a diagram illustrating a red, green and blue pixel structure of an organic light emitting device according to the first embodiment of the present invention.

FIG. 7 is a diagram illustrating a red, green and blue pixel structure of an organic light emitting device according to the first embodiment of the present invention.

Referring to FIG. 7, a first electrode (an anode electrode) 110 is a reflective electrode, and is formed in a structure where an ITO layer (70 Å), a reflective layer (APC, 100 Å), and an ITO layer (70 Å) are stacked. In this case, the reflective layer (APC) is formed of an alloy which contains silver (Ag) by 90% or more.

The first electrode (the anode electrode) 110 is formed in units of one unit pixel. One unit pixel is composed of a red pixel, a green pixel and a blue pixel of three colors, and the pixels of three colors are divided by a bank (not shown).

A hole injection layer (HIL) 115 is formed by depositing an HAT-CN material on the first electrode (the anode electrode) 110 to a thickness of 10 nm. A hole transport layer (HTL) 120 is formed by depositing NPD on the HIL 115 to a thickness of 37.5 nm.

A first red EML (red EML1) 132 is formed in a red pixel area Rp on a first HTL (HTL1) 120. The first red EML (red EML1) 132 is formed to a thickness of 70 nm by doping Rubrene (which is a red dopant (RD)) on Alq₃ (which is a red host (RH)) by 5%.

A first green EML (green EML1) 134 is formed in a green pixel area Gp on the first HTL (HTL1) 120. The first green EML (green EML1) 134 is formed to a thickness of 40 nm by doping Quinacridone (which is a green dopant (GD)) on Anthracene derivatives (which are a green host (GH)) by 5%.

A first blue EML (blue EML1) 136 is formed in a blue pixel area Bp on the first HTL (HTL1) 120. The first blue EML (blue EML1) 136 is formed to a thickness of 20 nm by doping Pyren derivatives (which are a blue dopant (BD)) on Anthracene derivatives (which are a blue host (BH)) by 5%.

A first ETL (ETL1) is formed by doping Alq₃ on the first red EML (red EML1) 132, the first green EML (green EML1) 134, and the first blue EML (blue EML1) 136 to a thickness of 25 nm.

A first charge generation layer (N-CGL) 145 is formed on a first ETL 140. The first generation layer (N-CGL) 145 is formed to a thickness of 10 nm by doping Li on Anthracene derivatives by 2%.

A second charge generation layer (P-CGL) 150 is formed by depositing HAT-CN on the first charge generation layer (N-CGL) 145 to a thickness of 10 nm.

A second HTL (HTL2) 155 is formed by depositing NPD on the second charge generation layer (P-CGL) 150 to a thickness of 37.5 nm.

A second red EML (red EML2) 162 is formed in a red pixel area Rp on the second HTL (HTL2) 155. The second red EML (red EML2) 162 is formed to a thickness of 70 nm by doping Rubrene (which is a red dopant (RD)) on $Alq_3$ (which is a red host (RH)) by 5%.

A second green EML (green EML2) 164 is formed in a green pixel area Gp on the second HTL (HTL2) 155. The second green EML (green EML2) 164 is formed to a thickness of 40 nm by doping Quinacridone (which is a green dopant (GD)) on Anthracene derivatives (which are a green host (GH)) by 5%.

Here, the first EML (EML1) and the second EML (EML2) which are formed in each of the red pixel, and the green pixel and the blue pixel are all formed of a fluorescent material.

A second blue EML (blue EML2) 166 is formed in a blue pixel area Bp on the second HTL (HTL2) 155. The second blue EML (blue EML2) 166 is formed to a thickness of 20 nm by doping Pyren derivatives (which are a blue dopant (BD)) on Anthracene derivatives (which are a blue host (BH)) by 5%.

A second ETL (ETL2) 170 is formed by depositing, to a thickness of 35 nm, $Alq_3$ and LiQ on the second red EML (red EML2) 162, the second green EML (green EML2) 164, and the second blue EML (blue EML2) 166 at a ratio of 1:1.

A second electrode (cathode electrode) 175 which is a semi-transmissive electrode is formed by forming a Mg:LiF layer on the second ETL (ETL2) 170 to a thickness of 15 Å and forming a Ag:Mg layer at a ratio of 1:1 to a thickness of 160 Å.

A capping layer 180 is formed by depositing NPD on the second electrode (the cathode electrode) 175 to a thickness of 65 nm to cover a pixel.

Experiment Conditions of Second Embodiment of the Present Invention

Figure 8:
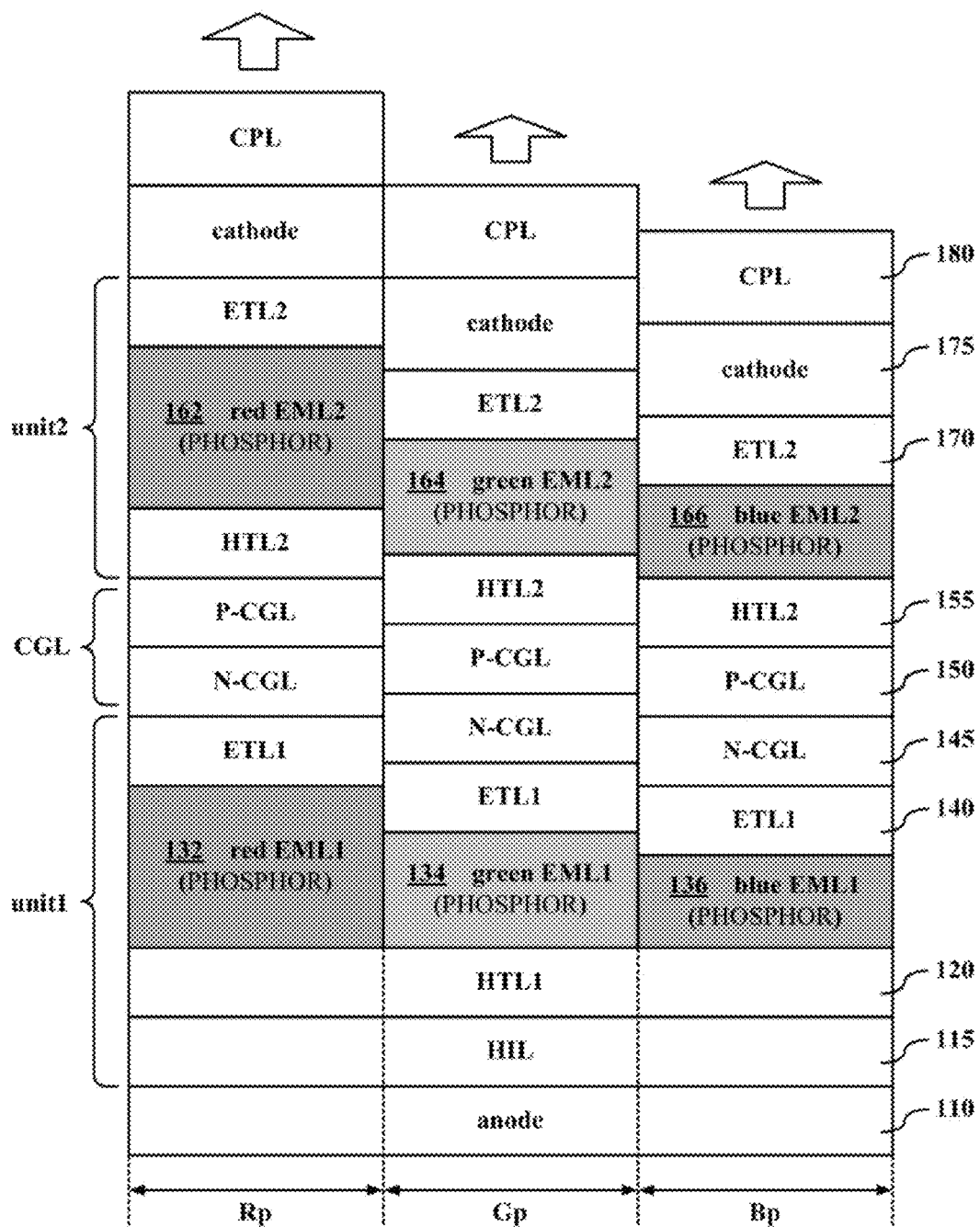
FIG. 8 is a diagram illustrating a red, green and blue pixel structure of an organic light emitting device according to the second embodiment of the present invention.

FIG. 8 is a diagram illustrating a red, green and blue pixel structure of an organic light emitting device according to the second embodiment of the present invention.

Referring to FIG. 8, a first electrode (an anode electrode) 110 is a reflective electrode, and is formed in a structure where an ITO layer (70 Å), a reflective layer (APC, 100 Å), and an ITO layer (70 Å) are stacked. In this case, the reflective layer (APC) is formed of an alloy which contains silver (Ag) by 90% or more.

The first electrode (the anode electrode) 110 is formed in units of one unit pixel. One unit pixel is composed of a red pixel, a green pixel, and a blue pixel of three colors, and the pixels of three colors are divided by a bank (not shown).

A hole injection layer (HIL) 115 is formed by depositing an HAT-CN material on the first electrode (the anode electrode) 110 to a thickness of 10 nm. A hole transport layer (HTL) 120 is formed by depositing NPD on the HIL 115 to a thickness of 37.5 nm.

A first red EML (red EML1) 132 is formed in a red pixel area Rp on a first HTL (HTL1) 120. The first red EML (red EML1) 132 is formed to a thickness of 70 nm by doping $Btp_2Ir(acac)$ (which is a red dopant (RD)) on Be complex (which is a red host (RH)) by 5%.

A first green EML (green EML1) 134 is formed in a green pixel area Gp on the first HTL (HTL1) 120. The first green EML (green EML1) 134 is formed to a thickness of 40 nm by doping $Ir(ppy)_3$ (which is a green dopant (GD)) on CBP (which is a green host (GH)) by 5%.

A first blue EML (blue EML1) 136 is formed in a blue pixel area Bp on the first HTL (HTL1) 120. The first blue EML (blue EML1) 136 is formed to a thickness of 20 nm by doping $F_2Irpic$ (which is a blue dopant (BD)) on mCP (which is a blue host (BH)) by 5%.

A first ETL (ETL1) is formed by doping $Alq_3$ on the first red EML (red EML1) 132, the first green EML (green EML1) 134, and the first blue EML (blue EML1) 136 to a thickness of 25 nm.

A first charge generation layer (N-CGL) 145 is formed on a first ETL 140. The first generation layer (N-CGL) 145 is formed to a thickness of 10 nm by doping Li on Anthracene derivatives by 2%.

A second charge generation layer (P-CGL) 150 is formed by depositing HAT-CN on the first charge generation layer (N-CGL) 145 to a thickness of 10 nm.

A second HTL (HTL2) 155 is formed by depositing NPD on the second charge generation layer (P-CGL) 150 to a thickness of 37.5 nm.

A second red EML (red EML2) 162 is formed in a red pixel area Rp on the second HTL (HTL2) 155. The second red EML (red EML2) 162 is formed to a thickness of 70 nm by doping $Btp_2Ir(acac)$ (which is a red dopant (RD)) on Be complex (which is a red host (RH)) by 5%.

A second green EML (green EML2) 164 is formed in a green pixel area Gp on the second HTL (HTL2) 155. The second green EML (green EML2) 164 is formed to a thickness of 40 nm by doping $Ir(ppy)_3$ (which is a green dopant (GD)) on CBP (which is a green host (GH)) by 5%.

A second blue EML (blue EML2) 166 is formed in a blue pixel area Bp on the second HTL (HTL2) 155. The second blue EML (blue EML2) 166 is formed to a thickness of 20 nm by doping $F_2Irpic$ (which is a blue dopant (BD)) on mCP (which is a blue host (BH)) by 5%.

Here, the first EML (EML1) and the second EML (EML2) which are formed in each of the red pixel, and the green pixel and the blue pixel are all formed of a fluorescent material.

The second blue EML (blue EML2) 166 is formed in a blue pixel area Bp on the second HTL (HTL2) 155. The second blue EML (blue EML2) 166 is formed to a thickness of 20 nm by doping Pyren derivatives (which are a blue dopant (BD)) on Anthracene derivatives (which are a blue host (BH)) by 5%.

A second ETL (ETL2) 170 is formed by depositing, to a thickness of 35 nm, $Alq_3$ and LiQ on the second red EML (red EML2) 162, the second green EML (green EML2) 164, and the second blue EML (blue EML2) 166 at a ratio of 1:1.

A second electrode (a cathode electrode) 175 which is a semi-transmissive electrode is formed by forming a Mg:LiF layer on the second ETL (ETL2) 170 to a thickness of 15 Å and forming a Ag:Mg layer at a ratio of 1:1 to a thickness of 160 Å.

A capping layer 180 is formed by depositing NPD on the second electrode (the cathode electrode) 175 to a thickness of 65 nm to cover a pixel.

Performance of First to Third Embodiments and Simulation Results of OLED Panel

FIG. 9 is a table showing performance of an organic light emitting device according to the first to seventh embodiments of the present invention, and FIG. 10 is a table showing simulation results of an OLED panel applied to an organic light emitting device according to the first to seventh embodiments of the present invention.

The performance results of the comparative example of FIG. 3 and the simulation results of an OLED panel will be described in comparison with the first to third embodiments of the present invention illustrated in FIGS. 9 and 10.

Similarly to the first embodiment illustrated in FIG. 7, the first EML (EML1) and second EML (EML2) of each of the red, green and blue pixels are all formed of a fluorescent material.

In the first embodiment, the color coordinates of the blue light are CIE_x of 0.143 and CIE_y of 0.042. The luminance of the blue light is 8.1 Cd/A. The color coordinates of the green light are CIE_x of 0.210 and CIE_y of 0.73. The luminance of the green light is 111 Cd/A. The color coordinates of the red light are CIE_x of 0.675 and CIE_y of 0.323. The luminance of the red light is 38 Cd/A. The color coordinates of white light are CIE_x of 0.299 and CIE_y of 0.315. The luminance of the white light is 48.9 Cd/A.

With respect to T95, the service life of the blue light is 600 or less hours, the service life of the green light is 1,100 or less hours, and the service life of the red light is 1,800 hours. With respect to T95, the service life of the white light is 1,150 or less hours.

When the first EML (EML1) and second EML (EML2) of each of the red, green and blue pixels are all formed of a fluorescent material, the service life is enhanced in comparison with a case where the first EML (EML1) and second EML (EML2) are all formed of a phosphor material, but the luminance can be lowered and the power consumption can increase.

As in the second embodiment illustrated in FIG. 8, the first EML (EML1) and second EML (EML2) of each of the red, green and blue pixels may all be formed of a phosphor material.

In the second embodiment, the color coordinates of the blue light are CIE_x of 0.143 and CIE_y of 0.055. The luminance of the blue light is 11.5 Cd/A. The color coordinates of the green light are CIE_x of 0.180 and CIE_y of 0.73. The luminance of the green light is 161 Cd/A. The color coordinates of the red light are CIE_x of 0.674 and CIE_y of 0.323. The luminance of the red light is 80 Cd/A. The color coordinates of the white light are CIE_x of 0.299 and CIE_y of 0.315. The luminance of the white light is 69.7 Cd/A.

With respect to T95, the service life of the blue light is 600 or less hours, the service life of the green light is 1,300 or less hours, and the service life of the red light is 1,400 hours. With respect to T95, the service life of the white light is 825 or less hours.

When the first EML (EML1) and second EML (EML2) of each of the red, green and blue pixels are all formed of a phosphor material, the luminance is enhanced in comparison with a case where the first EML (EML1) and second EML (EML2) are all formed of a fluorescent material, but the service life of an EML can be shortened. In particular, the service life of each of the first blue EML (blue EML1) 136 and the second blue EML (blue EML2) can be greatly shortened.

According to the third embodiment, the first EML and second EML of each of the blue pixel and the green pixel may be formed of a fluorescent material. The first EML and second EML of the red pixel may be formed of a phosphor material.

In the third embodiment, the color coordinates of the blue light are CIE_x of 0.143 and CIE_y of 0.042. The luminance of the blue light is 8.1 Cd/A. The color coordinates of the green light are CIE_x of 0.210 and CIE_y of 0.73. The luminance of the green light is 111 Cd/A. The color coordinates of the red light are CIE_x of 0.674 and CIE_y of 0.323. The luminance of the red light is 80 Cd/A. The color coordinates of white light are CIE_x of 0.299 and CIE_y of 0.315. The luminance of the white light is 59.5 Cd/A.

With respect to T95, the service life of the blue light is 600 or less hours, the service life of the green light is 1,100 or less hours, and the service life of the red light is 1,400 hours. With respect to T95, the service life of the white light is 1,150 or less hours.

A balance of white light should be adjusted for implementing an OLED panel. An efficiency of white light can be most greatly affected by an efficiency of blue light. In other words, despite that an efficiency of green light and red light is high, high efficiency of white light may not be generated when the efficiency of blue light is reduced. When two EMLs are all formed of either a phosphor material or a fluorescent material, light efficiency of some colors may unnecessarily increase, or light efficiency may rapidly decrease.

In an organic light emitting device according to another embodiment of the present invention, a first EML (EML1) and a second EML (EML2) of each of a red pixel Rp, a green pixel Gp and a blue pixel Bp may be formed of different materials (e.g., a phosphor material and a fluorescent material) in order to enhance the light efficiency and service life of each of the red pixel Rp, the green pixel Gp and the blue pixel Bp.

That is, the first EML (EML1) may be formed of a phosphor material, and the second EML (EML2) may be formed of a fluorescent material. On the other hand, the first EML (EML1) may be formed of a fluorescent material, and the second EML (EML2) may be formed of a phosphor material.

In an organic light emitting device according to the fourth to seventh embodiments of the present invention, each of the red, green and blue pixels includes a first EML and a second EML. The first EML and second EML of at least one selected from the red pixel, the green pixel and the blue pixel include different light emitting materials.

The first EML (EML1) of at least one selected from the red, green and blue pixels may be formed of a phosphor material, and the second EML (EML2) may be formed of a fluorescent material. On the other hand, the first EML (EML1) of at least one selected from the red, green and blue pixels may be formed of a fluorescent material, and the second EML (EML2) may be formed of a phosphor material.

FIG. 9 is a table showing performance of an organic light emitting device according to the first to seventh embodiments of the present invention, and FIG. 10 is a table showing simulation results of an OLED panel applied to an organic light emitting device according to the first to seventh embodiments of the present invention. The performance of the comparative example of FIG. 3 and the simulation results of the OLED panel will be described in comparison with the fourth to the seventh embodiments of the present invention illustrated in FIGS. 9 and 10.

Performance of Fourth Embodiment and Simulation Result of OLED Panel

Referring to FIGS. 9 and 10, in an organic light emitting device according to the fourth embodiment of the present invention, a first EML (blue EML1) of a blue pixel is formed of a fluorescent material, and a second EML (blue EML2) is formed of a phosphor material. A first EML (green EML1) of a green pixel is formed of a fluorescent material, and a second EML (blue EML2) is formed of a phosphor material. A first EML (red EML1) of a red pixel is formed of a fluorescent material, and a second EML (red EML2) is formed of a phosphor material.

In the fourth embodiment, the color coordinates of the blue light are CIE_x of 0.143 and CIE_y of 0.045. The luminance of the blue light is 9.1 Cd/A. The color coordinates of green light are CIE_x of 0.215 and CIE_y of 0.73. The luminance of the green light is 130 Cd/A. The color coordinates of red light are CIE_x of 0.675 and CIE_y of 0.323. The luminance of the red light is 55 Cd/A. The color coordinates of the white light are CIE_x of 0.299 and CIE_y of 0.315. The luminance of the white light is 58.6 Cd/A.

With respect to T95, the service life of the blue light is 450 or less hours, the service life of the green light is 1,200 or less hours, and the service life of the red light is 1,500 hours. With respect to T95, the service life of the white light is 1,125 or less hours. In this case, power consumption is 769 mW.

Performance of Fifth Embodiment and Simulation Result of OLED Panel

Referring to FIGS. 9 and 10, in an organic light emitting device according to the fifth embodiment of the present invention, a first EML (blue EML1) of a blue pixel is formed of a fluorescent material, and a second EML (blue EML2) is formed of a fluorescent material. A first EML (green EML1) of a green pixel is formed of a fluorescent material, and a second EML (blue EML2) is formed of a phosphor material. A first EML (red EML1) of a red pixel is formed of a phosphor material, and a second EML (red EML2) is formed of a phosphor material.

In the fifth embodiment, the color coordinates of the blue light are $CIE\_x$ of 0.143 and $CIE\_y$ of 0.042. The luminance of the blue light is 8.1 Cd/A. The color coordinates of the green light are $CIE\_x$ of 0.215 and $CIE\_y$ of 0.73. The luminance of the green light is 130 Cd/A. The color coordinates of the red light are $CIE\_x$ of 0.674 and $CIE\_y$ of 0.323. The luminance of the red light is 80 Cd/A. The color coordinates of the white light are $CIE\_x$ of 0.299 and $CIE\_y$ of 0.315. The luminance of the white light is 62.7 Cd/A.

With respect to T95, the service life of the blue light is 600 or less hours, the service life of the green light is 1,200 or less hours, and the service life of the red light is 1,400 hours. With respect to T95, the service life of the white light is 1,175 or less hours. In this case, power consumption is 819 mW.

Performance of Sixth Embodiment and Simulation Result of OLED Panel

Referring to FIGS. 9 and 10, in an organic light emitting device according to the sixth embodiment of the present invention, a first EML (blue EML1) of a blue pixel is formed of a fluorescent material, and a second EML (blue EML2) is formed of a fluorescent material. A first EML (green EML1) of a green pixel is formed of a fluorescent material, and a second EML (blue EML2) is formed of a phosphor material. A first EML (red EML1) of a red pixel is formed of a fluorescent material, and a second EML (red EML2) is formed of a fluorescent material.

In the sixth embodiment, the color coordinates of the blue light are $CIE\_x$ of 0.143 and $CIE\_y$ of 0.042. The luminance of the blue light is 8.1 Cd/A. The color coordinates of the green light are $CIE\_x$ of 0.215 and $CIE\_y$ of 0.73. The luminance of the green light is 130 Cd/A. The color coordinates of the red light are $CIE\_x$ of 0.675 and $CIE\_y$ of 0.323. The luminance of the red light is 38 Cd/A. The color coordinates of the white light are $CIE\_x$ of 0.299 and $CIE\_y$ of 0.315. The luminance of the white light is 54.2 Cd/A.

With respect to T95, the service life of the blue light is 600 or less hours, the service life of the green light is 1,200 or less hours, and the service life of the red light is 1,800 hours. With respect to T95, the service life of the white light is 1,200 or less hours. In this case, power consumption is 819 mW.

Performance of Seventh Embodiment and Simulation Result of OLED Panel

Referring to FIGS. 9 and 10, in an organic light emitting device according to the seventh embodiment of the present invention, a first EML (blue EML1) of a blue pixel is formed of a fluorescent material, and a second EML (blue EML2) is formed of a fluorescent material. A first EML (green EML1) of a green pixel is formed of a fluorescent material, and a second EML (blue EML2) is formed of a phosphor material. A first EML (red EML1) of a red pixel is formed of a fluorescent material, and a second EML (red EML2) is formed of a phosphor material.

In the seventh embodiment, the color coordinates of the blue light are $CIE\_x$ of 0.143 and $CIE\_y$ of 0.042. The luminance of the blue light is 8.1 Cd/A. The color coordinates of the green light are $CIE\_x$ of 0.215 and $CIE\_y$ of 0.73. The luminance of the green light is 130 Cd/A. The color coordinates of the red light are $CIE\_x$ of 0.675 and $CIE\_y$ of 0.323. The luminance of the red light is 55 Cd/A. The color coordinates of the white light are $CIE\_x$ of 0.299 and $CIE\_y$ of 0.315. The luminance of the white light is 57.6 Cd/A.

With respect to T95, the service life of the blue light is 600 or less hours, the service life of the green light is 1,200 or less hours, and the service life of the red light is 1,500 hours. With respect to T95, the service life of the white light is 1,200 or less hours. In this case, power consumption is 735 mW.

FIG. 11 is a table showing correlated color temperature (CCT) with respect to T95 when driving time of an organic light emitting device according to the related art elapses, and FIG. 12 is a table showing CCT with respect to T95 when driving time of an organic light emitting device according to the first to seventh embodiments of the present invention elapses.

Performance of an organic light emitting device according to the fourth to seventh embodiments of the present invention and simulation results of an OLED panel will be compared with a comparative example with reference to FIGS. 11 and 12.

The organic light emitting device according to the fourth to seventh embodiments of the present invention is far more stable than a CCT comparative example, and the service life of the OLED panel increases by a factor of 2 or more with respect to T95. Also, the power consumption of the organic light emitting device according to the fourth to seventh embodiments of the present invention is equal to or lower than that of the comparative example.

In particular, in the sixth and seventh embodiments, the luminance of the red pixel is 38 Cd/A, and the luminance of the red pixel is 55 Cd/A. The luminance of the red pixel is lower than that of the comparative example, but power consumption can be greatly lowered. Also, the service life of the OLED panel is enhanced by a factor of 2 or more, and thus, the OLED panel can be easily applied to a display device.

Figure 13:
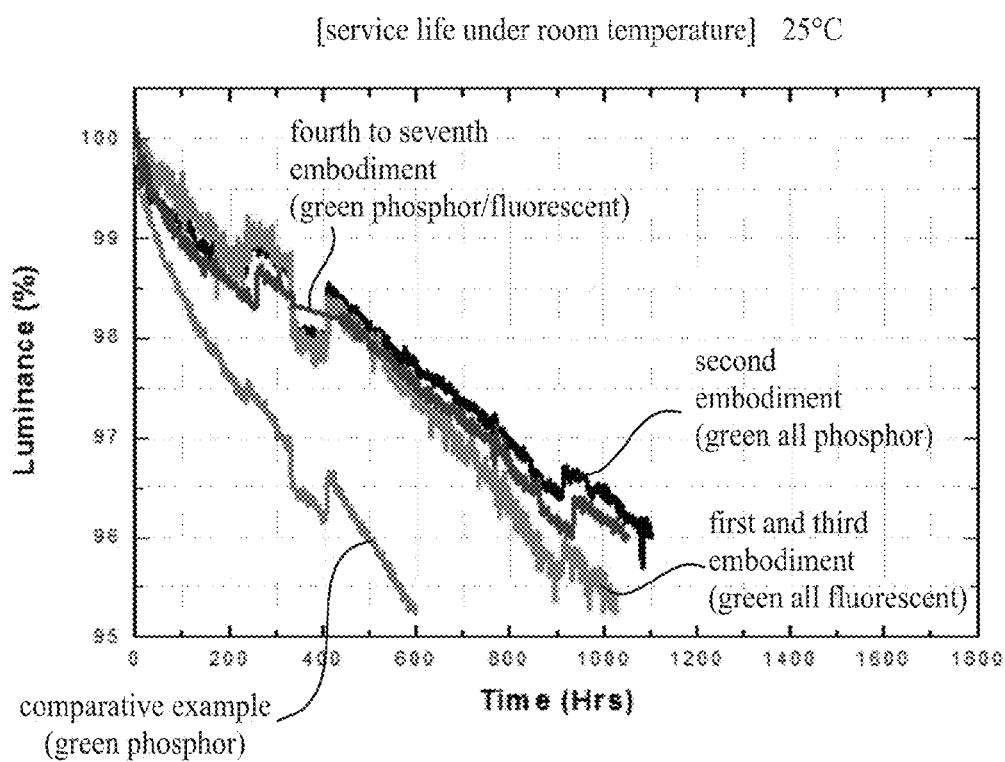
FIG. 13 is a graph showing service life of an organic light emitting device according to an embodiment of the present invention and service life of a comparative example under the room temperature at 25° C.
Figure 14:
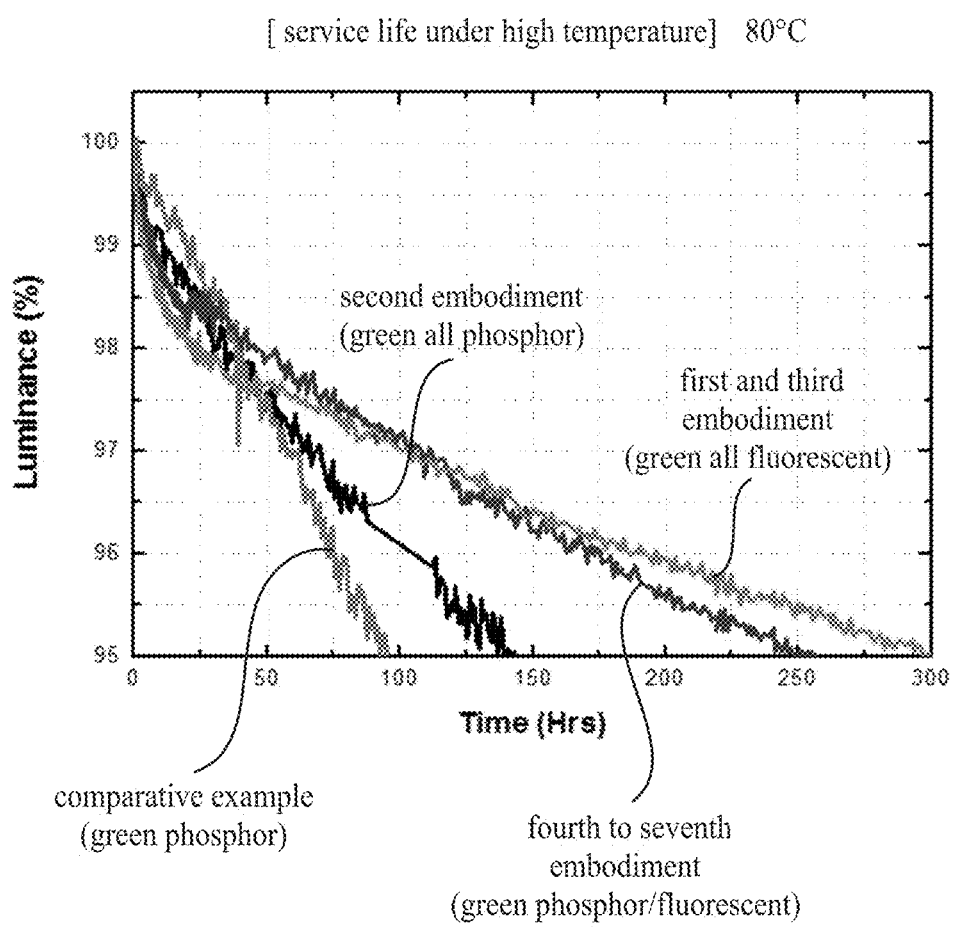
FIG. 14 is a graph showing service life of an organic light emitting device according to an embodiment of the present invention and service life of a comparative example under a high temperature at 80° C.

FIG. 13 is a graph showing service life of an organic light emitting device according to an embodiment of the present invention and service life of a comparative example under the room temperature at 25° C., and FIG. 14 is a graph showing service life of an organic light emitting device according to an embodiment of the present invention and service life of a comparative example under a high temperature at 80° C.

Referring to FIGS. 13 and 14, among red, green and blue light, green light is much more influential on generating white light, and thus, exerts the most influence on service life of white light.

In FIG. 13, which shows service life under the room temperature at 25° C., when a phosphor material is applied to all of two EMLs, the service life is 1,300 or less hours (with respect to T95), and when a fluorescent material is applied to all the two EMLs, the service life is 1,100 or less hours (with respect to T95). That is, when a phosphor material is applied to an EML, the service life of an OLED panel can increase. However, as shown in FIG. 14, a phosphor material is such that the service life rapidly decreases under a high temperature at 80° C.

According to the fourth to seventh embodiments of the present invention, when an EML of each pixel is configured with two emission units, a phosphor material is applied to one of the two EMLs, and a fluorescent material is applied to the other EML, the luminance of each pixel can be enhanced, and the service life of the OLED panel can increase. Also, the luminance and service life can be enhanced by adjusting a balance of white light in the OLED panel, and power consumption can also be reduced. In particular, the service life of the green pixel can be prevented from being rapidly reduced when the OLED panel is driven under a high temperature, and thus, the service life of the OLED panel can be enhanced.

FIG. 15 is a diagram illustrating a first emission layer and a second emission layer of an organic light emitting device according to the eight to thirteenth embodiments of the present invention.

Referring to FIG. 15, in an organic light emitting device according to the eighth embodiment of the present invention, a first EML (blue EML1) of a blue pixel may be formed of a fluorescent material, and a second EML (blue EML2) may be formed of a phosphor material. A first EML (green EML1) of a green pixel may be formed of a phosphor material, and a second EML (blue EML2) may be formed of a fluorescent material. A first EML (red EML1) of a red pixel may be formed of a fluorescent material, and a second EML (red EML2) may be formed of a phosphor material.

In an organic light emitting device according to the ninth embodiment of the present invention, a first EML (blue EML1) of a blue pixel may be formed of a phosphor material, and a second EML (blue EML2) may be formed of a phosphor material. A first EML (green EML1) of a green pixel may be formed of a fluorescent material, and a second EML (blue EML2) may be formed of a phosphor material. A first EML (red EML1) of a red pixel may be formed of a phosphor material, and a second EML (red EML2) may be formed of a phosphor material.

In an organic light emitting device according to the tenth embodiment of the present invention, a first EML (blue EML1) of a blue pixel may be formed of a phosphor material, and a second EML (blue EML2) may be formed of a phosphor material. A first EML (green EML1) of a green pixel may be formed of a phosphor material, and a second EML (blue EML2) may be formed of a phosphor material. A first EML (red EML1) of a red pixel may be formed of a fluorescent material, and a second EML (red EML2) may be formed of a phosphor material.

In an organic light emitting device according to the eleventh embodiment of the present invention, a first EML (blue EML1) of a blue pixel may be formed of a fluorescent material, and a second EML (blue EML2) may be formed of a phosphor material. A first EML (green EML1) of a green pixel may be formed of a fluorescent material, and a second EML (blue EML2) may be formed of a phosphor material. A first EML (red EML1) of a red pixel may be formed of a phosphor material, and a second EML (red EML2) may be formed of a phosphor material.

In an organic light emitting device according to the twelfth embodiment of the present invention, a first EML (blue EML1) of a blue pixel may be formed of a fluorescent material, and a second EML (blue EML2) may be formed of a phosphor material. A first EML (green EML1) of a green pixel may be formed of a phosphor material, and a second EML (blue EML2) may be formed of a phosphor material. A first EML (red EML1) of a red pixel may be formed of a fluorescent material, and a second EML (red EML2) may be formed of a phosphor material.

In an organic light emitting device according to the thirteenth embodiment of the present invention, a first EML (blue EML1) of a blue pixel may be formed of a phosphor material, and a second EML (blue EML2) may be formed of a phosphor material. A first EML (green EML1) of a green pixel may be formed of a fluorescent material, and a second EML (blue EML2) may be formed of a phosphor material. A first EML (red EML1) of a red pixel may be formed of a fluorescent material, and a second EML (red EML2) may be formed of a phosphor material.

FIG. 16 is a diagram illustrating a first emission layer and a second emission layer of an organic light emitting device according to the fourteenth to twentieth embodiments of the present invention.

A first EML (EML1) of at least one selected from a red pixel, a green pixel, and a blue pixel may be formed of a phosphor material, and a second EML (EML2) may be formed of a fluorescent material. On the other hand, a first EML (EML1) of at least one selected from a red pixel, a green pixel, and a blue pixel may be formed of a fluorescent material, and a second EML (EML2) may be formed of a phosphor material.

Referring to FIG. 16, in an organic light emitting device according to the fourteenth embodiment of the present invention, a first EML (blue EML1) of a blue pixel may be formed of a phosphor material, and a second EML (blue EML2) may be formed of a fluorescent material. A first EML (green EML1) of a green pixel may be formed of a phosphor material, and a second EML (blue EML2) may be formed of a fluorescent material. A first EML (red EML1) of a red pixel may be formed of a phosphor material, and a second EML (red EML2) may be formed of a fluorescent material.

In an organic light emitting device according to the fifteenth embodiment of the present invention, a first EML (blue EML1) of a blue pixel may be formed of a phosphor material, and a second EML (blue EML2) may be formed of a fluorescent material. A first EML (green EML1) of a green pixel may be formed of a fluorescent material, and a second EML (blue EML2) may be formed of a fluorescent material. A first EML (red EML1) of a red pixel may be formed of a fluorescent material, and a second EML (red EML2) may be formed of a fluorescent material.

In an organic light emitting device according to the sixteenth embodiment of the present invention, a first EML (blue EML1) of a blue pixel may be formed of a fluorescent material, and a second EML (blue EML2) may be formed of a fluorescent material. A first EML (green EML1) of a green pixel may be formed of a phosphor material, and a second EML (blue EML2) may be formed of a fluorescent material. A first EML (red EML1) of a red pixel may be formed of a fluorescent material, and a second EML (red EML2) may be formed of a fluorescent material.

In an organic light emitting device according to the seventeenth embodiment of the present invention, a first EML (blue EML1) of a blue pixel may be formed of a fluorescent material, and a second EML (blue EML2) may be formed of a fluorescent material. A first EML (green EML1) of a green pixel may be formed of a fluorescent material, and a second EML (blue EML2) may be formed of a fluorescent material. A first EML (red EML1) of a red pixel may be formed of a phosphor material, and a second EML (red EML2) may be formed of a fluorescent material.

In an organic light emitting device according to the eighteenth embodiment of the present invention, a first EML (blue EML1) of a blue pixel may be formed of a phosphor material, and a second EML (blue EML2) may be formed of a fluorescent material. A first EML (green EML1) of a green pixel may be formed of a phosphor material, and a second EML (blue EML2) may be formed of a fluorescent material. A first EML (red EML1) of a red pixel may be formed of a fluorescent material, and a second EML (red EML2) may be formed of a fluorescent material.

In an organic light emitting device according to the nineteenth embodiment of the present invention, a first EML (blue EML1) of a blue pixel may be formed of a phosphor material, and a second EML (blue EML2) may be formed of a fluorescent material. A first EML (green EML1) of a green pixel may be formed of a fluorescent material, and a second EML (blue EML2) may be formed of a phosphor material. A first EML (red EML1) of a red pixel may be formed of a phosphor material, and a second EML (red EML2) may be formed of a fluorescent material.

In an organic light emitting device according to the twentieth embodiment of the present invention, a first EML (blue EML1) of a blue pixel may be formed of a phosphor material, and a second EML (blue EML2) may be formed of a fluorescent material. A first EML (green EML1) of a green pixel may be formed of a phosphor material, and a second EML (blue EML2) may be formed of a fluorescent material. A first EML (red EML1) of a red pixel may be formed of a phosphor material, and a second EML (red EML2) may be formed of a fluorescent material.

According to the eighth to twentieth embodiments of the present invention, when an EML of each of the red, green and blue pixels is configured with two emission units, and first and second EMLs of at least one selected from the red, green and blue pixels are formed of different light emitting materials, the luminance of each pixel can be enhanced, and the service life of the OLED panel can increase. Also, the luminance and service life can be enhanced by adjusting a balance of white light in the OLED panel, and power consumption can be reduced.

As described above, the first emission layer and second emission layer of at least one selected from the organic emission red pixel, the organic emission green pixel and the organic emission blue pixel according to the embodiments of the present invention are formed of different light emitting materials, thereby enhancing emission efficiency.

Also, the first emission layer and second emission layer of at least one selected from the organic emission red pixel, the organic emission green pixel and the organic emission blue pixel according to the embodiments of the present invention are formed of different light emitting materials, thereby enhancing service life of each of an OLED and an OLED panel to which the OLED is applied.

Moreover, the first emission layer and second emission layer of at least one selected from the organic emission red pixel, the organic emission green pixel and the organic emission blue pixel according to the embodiments of the present invention are formed of different light emitting materials, thereby increasing luminance of each of red, green, blue and white lights.

Furthermore, the first emission layer and second emission layer of at least one selected from the organic emission red pixel, the organic emission green pixel and the organic emission blue pixel according to the embodiments of the present invention are formed of different light emitting materials, thereby decreasing power consumption.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device comprising:
a red pixel including a first red emission layer and a second red emission layer that emit red lights;
a green pixel including a first green emission layer and a second green emission layer that emit green lights;
a blue pixel including a first blue emission layer and a second blue emission layer that emit blue lights;
a first electrode and a second electrode that supply electric charges to the red, green and blue pixels;
a hole injection layer on the first electrode;
a first hole transport layer on the hole injection layer;
a first electron transport layer on the first red emission layer, the first green emission layer and the first blue emission layer;
a second hole transport layer on the second red emission layer, the second green emission layer and the second blue emission layer in a direction toward the first electrode; and
a second electron transport layer on the second red emission layer, the second green emission layer and the second blue emission layer in a direction toward the second electrode,
wherein a first emission layer and a second emission layer of one or more of the red, green and blue pixels include different materials between a fluorescent material and a phosphor material.

2. The organic light emitting device of claim 1, wherein the first electrode is a reflective electrode and the second electrode is a transmissive or semi-transmissive electrode.

3. The organic light emitting device of claim 1, wherein,
the first red emission layer is formed of a fluorescent material, and the second red emission layer is formed of a phosphor material, or
the first red emission layer is formed of a phosphor material, and the second red emission layer is formed of a fluorescent material.

4. The organic light emitting device of claim 1, wherein,
the first green emission layer is formed of a fluorescent material, and the second green emission layer is formed of a phosphor material, or
the first green emission layer is formed of a phosphor material, and the second green emission layer is formed of a fluorescent material.

5. The organic light emitting device of claim 1, wherein,
the first blue emission layer is formed of a fluorescent material, and the second blue emission layer is formed of a phosphor material, or
the first blue emission layer is formed of a phosphor material, and the second blue emission layer is formed of a fluorescent material.

6. The organic light emitting device of claim 1, wherein,
an organic emission layer of the red pixel including the first red emission layer and the second red emission layer is formed to a thickness of 250 nm to 310 nm,
an organic emission layer of the green pixel including the first green emission layer and the second green emission layer is formed to a thickness of 200 nm to 270 nm, and
an organic emission layer of the blue pixel including the first blue emission layer and the second blue emission layer is formed to a thickness of 150 nm to 230 nm.

7. The organic light emitting device of claim 1, wherein,
the first and second red emission layers are formed to a thickness of 55 nm to 85 nm,
the first and second green emission layers are formed to a thickness of 30 nm to 50 nm, and the first and second blue emission layers are formed to a thickness of 10 nm to 30 nm.

8. The organic light emitting device of claim 1, wherein an optical distance of a color cavity of a blue light is satisfied by using a thickness of the first hole transport layer.

9. The organic light emitting device of claim 1, wherein an optical distance of a color cavity of a red light is satisfied by using a thickness of at least one of the first red emission layer and the second red emission layer.

10. The organic light emitting device of claim 1, wherein an optical distance of a color cavity of a green light is satisfied by using a thickness of at least one of the first green emission layer and the second green emission layer.

11. The organic light emitting device of claim 1, further comprising a charge generation layer between the first electron transport layer and the second hole transport layer.

12. The organic light emitting device of claim 1, further comprising a charge generation layer between the first emission layer and the second emission layer.

13. The organic light emitting device of claim 1, wherein the first emission layer and the second emission layer of each of two of the red, green and blue pixels include different materials between a fluorescent material and a phosphor material.

14. The organic light emitting device of claim 1, wherein the first emission layer and the second emission layer of each of the red, green and blue pixels include different materials between a fluorescent material and a phosphor material.

* * * * *